(12) United States Patent
Ng et al.

(10) Patent No.: US 11,854,905 B2
(45) Date of Patent: Dec. 26, 2023

(54) SILICON AND SILICON GERMANIUM NANOWIRE FORMATION

(71) Applicant: Taiwan Semiconductor Manufacturing Co., Ltd., Hsinchu (TW)

(72) Inventors: Jin-Aun Ng, Hsinchu (TW); Kuo-Cheng Chiang, Zhubei (TW); Carlos H. Diaz, Los Altos Hills, CA (US); Jean-Pierre Colinge, Belgium (FR)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/814,692

(22) Filed: Jul. 25, 2022

(65) Prior Publication Data

US 2022/0359309 A1    Nov. 10, 2022

Related U.S. Application Data

(60) Continuation of application No. 16/870,248, filed on May 8, 2020, now Pat. No. 11,404,325, which is a
(Continued)

(51) Int. Cl.
*H01L 29/66* (2006.01)
*H01L 29/786* (2006.01)
(Continued)

(52) U.S. Cl.
CPC ...... *H01L 21/823821* (2013.01); *B82Y 10/00* (2013.01); *B82Y 40/00* (2013.01);
(Continued)

(58) Field of Classification Search
CPC ............ B82Y 10/00; H01L 21/823807; H01L 29/42392; H01L 29/66439; H01L 29/775; H01L 29/78696; H01L 29/0847
See application file for complete search history.

(56) References Cited

U.S. PATENT DOCUMENTS

| | | |
|---|---|---|
| 5,965,914 A | 10/1999 | Miyamoto |
| 6,921,700 B2 | 7/2005 | Orlowski et al. |

(Continued)

FOREIGN PATENT DOCUMENTS

| | | |
|---|---|---|
| CN | 102569409 A | 7/2012 |
| DE | 102019121928 | 3/2020 |

(Continued)

OTHER PUBLICATIONS

E. Dornel et al., "Hydrogen annealing of arrays of planar and vertically stacked Si nanowires" Applied Physics Letters 91, 233502, 2007, 3 pages.

(Continued)

*Primary Examiner* — Earl N Taylor
(74) *Attorney, Agent, or Firm* — Slater Matsil, LLP

(57) ABSTRACT

Among other things, one or semiconductor arrangements, and techniques for forming such semiconductor arrangements are provided. For example, one or more silicon and silicon germanium stacks are utilized to form PMOS transistors comprising germanium nanostructure channels and NMOS transistors comprising silicon nanostructure channels. In an example, a first silicon and silicon germanium stack is oxidized to transform silicon to silicon oxide regions, which are removed to form germanium nanostructure channels for PMOS transistors. In another example, silicon and germanium layers within a second silicon and silicon germanium stack are removed to form silicon nanostructure channels for NMOS transistors. PMOS transistors having germanium nanostructure channels and NMOS tran-
(Continued)

sistors having silicon nanostructure channels are formed as part of a single fabrication process.

20 Claims, 18 Drawing Sheets

Related U.S. Application Data continuation-in-part of application No. 16/599,307, filed on Oct. 11, 2019, now Pat. No. 10,943,833, which is a continuation of application No. 16/205,419, filed on Nov. 30, 2018, now Pat. No. 10,699,964, which is a continuation of application No. 15/924,350, filed on Mar. 19, 2018, now Pat. No. 10,163,729, which is a continuation of application No. 15/463,326, filed on Mar. 20, 2017, now Pat. No. 9,935,016, which is a continuation of application No. 14/929,504, filed on Nov. 2, 2015, now Pat. No. 9,634,091, which is a division of application No. 13/971,239, filed on Aug. 20, 2013, now Pat. No. 9,184,269.

(51) Int. Cl.

| | |
|---|---|
| *H01L 29/423* | (2006.01) |
| *H01L 29/775* | (2006.01) |
| *H01L 29/06* | (2006.01) |
| *H01L 27/092* | (2006.01) |
| *H01L 21/8238* | (2006.01) |
| *B82Y 40/00* | (2011.01) |
| *H01L 29/16* | (2006.01) |
| *H01L 29/78* | (2006.01) |
| *B82Y 10/00* | (2011.01) |

(52) U.S. Cl.
CPC .... *H01L 21/823807* (2013.01); *H01L 27/092* (2013.01); *H01L 27/0924* (2013.01); *H01L 29/0673* (2013.01); *H01L 29/16* (2013.01); *H01L 29/42392* (2013.01); *H01L 29/66439* (2013.01); *H01L 29/775* (2013.01); *H01L 29/78* (2013.01); *H01L 29/7853* (2013.01); *H01L 29/78696* (2013.01); *H01L 29/6681* (2013.01)

(56) References Cited

U.S. PATENT DOCUMENTS

| | | | |
|---|---|---|---|
| 7,112,832 B2 | 9/2006 | Orlowski et al. | |
| 7,229,884 B2 | 6/2007 | Park | |
| 7,354,831 B2 | 4/2008 | Orlowski | |
| 7,608,893 B2 | 10/2009 | Orlowski | |
| 7,642,578 B2 | 1/2010 | Lee et al. | |
| 7,727,830 B2 | 6/2010 | Jin et al. | |
| 7,821,061 B2 | 10/2010 | Jin et al. | |
| 7,829,916 B2 | 11/2010 | Morand et al. | |
| 7,999,251 B2 | 8/2011 | Chu et al. | |
| 8,084,308 B2 | 12/2011 | Chang et al. | |
| 8,110,458 B2 | 2/2012 | Jin et al. | |
| 8,110,471 B2 | 2/2012 | Lee et al. | |
| 8,129,768 B2 | 3/2012 | Shibata et al. | |
| 8,309,950 B2 | 11/2012 | Iwayama et al. | |
| 8,314,464 B2 | 11/2012 | Iwayama et al. | |
| 8,349,667 B2 | 1/2013 | Saracco et al. | |
| 8,399,314 B2 | 3/2013 | Cohen et al. | |
| 8,399,330 B2 | 3/2013 | Liu et al. | |
| 8,415,209 B2 | 4/2013 | Rooyackers et al. | |
| 8,445,892 B2 | 5/2013 | Cohen et al. | |
| 8,466,451 B2 | 6/2013 | Chang et al. | |
| 8,492,219 B2 | 7/2013 | Saitoh et al. | |
| 8,658,518 B1 | 2/2014 | Chang et al. | |
| 8,709,888 B2 | 4/2014 | Chang et al. | |
| 8,722,472 B2 | 5/2014 | Chang et al. | |
| 8,753,942 B2 | 6/2014 | Kuhn et al. | |
| 8,765,563 B2 | 7/2014 | Pillarisetty et al. | |
| 8,785,909 B2 | 7/2014 | Radosavljevic et al. | |
| 8,936,972 B2 | 1/2015 | Bangsaruntip et al. | |
| 8,940,645 B2 | 1/2015 | Ramkumar et al. | |
| 8,969,149 B2 | 3/2015 | Leobandung | |
| 9,064,944 B2 | 6/2015 | Kim et al. | |
| 9,123,567 B2 | 9/2015 | Radosavljevic et al. | |
| 9,129,829 B2 | 9/2015 | Kuhn et al. | |
| 9,171,843 B2 | 10/2015 | Ching et al. | |
| 9,184,269 B2 | 11/2015 | Ching et al. | |
| 9,224,810 B2 | 12/2015 | Kim et al. | |
| 9,318,573 B2 | 4/2016 | Moon et al. | |
| 9,595,581 B2 | 3/2017 | Kuhn et al. | |
| 9,634,007 B2 | 4/2017 | Pillarisetty et al. | |
| 9,634,091 B2 | 4/2017 | Ching et al. | |
| 9,691,851 B1* | 6/2017 | Fung | H01L 29/775 |
| 9,935,016 B2 | 4/2018 | Ching et al. | |
| 10,163,729 B2 | 12/2018 | Ching et al. | |
| 10,910,375 B2* | 2/2021 | Ching | B82Y 10/00 |
| 10,914,703 B2 | 2/2021 | Rozeau et al. | |
| 11,201,152 B2* | 12/2021 | Xie | H01L 29/0649 |
| 2004/0036128 A1 | 2/2004 | Zhang et al. | |
| 2004/0063286 A1 | 4/2004 | Kim et al. | |
| 2005/0023619 A1 | 2/2005 | Orlowski et al. | |
| 2005/0224889 A1 | 10/2005 | Oh et al. | |
| 2006/0049429 A1 | 3/2006 | Kim et al. | |
| 2006/0216897 A1 | 9/2006 | Lee et al. | |
| 2007/0029586 A1 | 2/2007 | Orlowski | |
| 2007/0126044 A1 | 6/2007 | Shioya et al. | |
| 2008/0017934 A1 | 1/2008 | Kim et al. | |
| 2008/0042120 A1 | 2/2008 | Shibata et al. | |
| 2008/0061284 A1 | 3/2008 | Chu et al. | |
| 2008/0142853 A1 | 6/2008 | Orlowski | |
| 2008/0237575 A1 | 10/2008 | Jin et al. | |
| 2008/0251381 A1 | 10/2008 | Shibata et al. | |
| 2008/0272366 A1 | 11/2008 | Moon et al. | |
| 2009/0081854 A1 | 3/2009 | Kim et al. | |
| 2009/0170251 A1 | 7/2009 | Jin et al. | |
| 2010/0068862 A1 | 3/2010 | Lee et al. | |
| 2010/0200835 A1 | 8/2010 | Jin et al. | |
| 2010/0295021 A1 | 11/2010 | Chang et al. | |
| 2011/0012090 A1 | 1/2011 | Singh et al. | |
| 2011/0058126 A1 | 3/2011 | Okada et al. | |
| 2011/0133167 A1 | 6/2011 | Bangsaruntip et al. | |
| 2011/0253982 A1 | 10/2011 | Wang et al. | |
| 2012/0138886 A1 | 6/2012 | Kuhn et al. | |
| 2012/0199812 A1 | 8/2012 | Baykan et al. | |
| 2013/0161756 A1 | 6/2013 | Glass et al. | |
| 2013/0270512 A1 | 10/2013 | Radosavljevic et al. | |
| 2013/0307052 A1 | 11/2013 | Jenne et al. | |
| 2014/0001520 A1 | 1/2014 | Glass et al. | |
| 2014/0042386 A1 | 2/2014 | Cea et al. | |
| 2014/0051213 A1 | 2/2014 | Chang et al. | |
| 2014/0091279 A1 | 4/2014 | Kachian et al. | |
| 2014/0091360 A1* | 4/2014 | Pillarisetty | H01L 21/845 257/190 |
| 2014/0131660 A1 | 5/2014 | Cea et al. | |
| 2014/0197377 A1 | 7/2014 | Kim et al. | |
| 2014/0209855 A1 | 7/2014 | Cea et al. | |
| 2014/0264253 A1 | 9/2014 | Kim et al. | |
| 2014/0264280 A1 | 9/2014 | Kim et al. | |
| 2014/0291726 A1 | 10/2014 | Pillarisetty et al. | |
| 2014/0326952 A1 | 11/2014 | Kuhn et al. | |
| 2014/0353591 A1 | 12/2014 | Kim et al. | |
| 2015/0035071 A1 | 2/2015 | Ching et al. | |
| 2015/0053928 A1 | 2/2015 | Ching et al. | |
| 2015/0129830 A1 | 5/2015 | Sung et al. | |
| 2015/0243733 A1* | 8/2015 | Yang | H01L 29/0673 257/401 |
| 2015/0370947 A1 | 12/2015 | Moroz et al. | |
| 2016/0056236 A1 | 2/2016 | Ching et al. | |
| 2017/0040321 A1 | 2/2017 | Mitard | |
| 2017/0047402 A1 | 2/2017 | Yang et al. | |
| 2017/0178971 A1 | 6/2017 | Merckling et al. | |
| 2017/0194215 A1 | 7/2017 | Ching et al. | |
| 2017/0194431 A1 | 7/2017 | Guillorn et al. | |
| 2017/0358646 A1 | 12/2017 | Fung | |
| 2018/0114727 A1 | 4/2018 | Rodder et al. | |

(56) References Cited

U.S. PATENT DOCUMENTS

| | | | |
|---|---|---|---|
| 2018/0156749 A1* | 6/2018 | Rozeau | G01N 23/2251 |
| 2018/0254348 A1* | 9/2018 | Ching | B82Y 10/00 |
| 2019/0172751 A1 | 6/2019 | Smith et al. | |
| 2019/0172755 A1 | 6/2019 | Smith et al. | |
| 2019/0326286 A1* | 10/2019 | Xie | H01L 29/401 |
| 2019/0393350 A1 | 12/2019 | Thompson et al. | |
| 2020/0006340 A1 | 1/2020 | Lilak et al. | |
| 2020/0006478 A1* | 1/2020 | Hsu | H01L 29/42392 |
| 2020/0058556 A1 | 2/2020 | Ching et al. | |
| 2020/0091144 A1* | 3/2020 | Guler | H01L 29/0673 |
| 2020/0098756 A1* | 3/2020 | Lilak | H01L 29/78696 |
| 2020/0098757 A1* | 3/2020 | Rachmady | H01L 29/66742 |
| 2020/0098859 A1* | 3/2020 | Reboh | H01L 29/42392 |
| 2020/0105751 A1* | 4/2020 | Dewey | H01L 27/092 |
| 2020/0111781 A1* | 4/2020 | Kim | H01L 29/6656 |
| 2020/0152740 A1* | 5/2020 | Jang | H01L 29/66553 |
| 2020/0161339 A1 | 5/2020 | Lee et al. | |
| 2020/0258740 A1 | 8/2020 | Lee et al. | |
| 2020/0273757 A1 | 8/2020 | Ng et al. | |
| 2021/0098473 A1* | 4/2021 | Lin | H01L 21/3065 |
| 2021/0217873 A1 | 7/2021 | Siddiqui et al. | |
| 2022/0352377 A1* | 11/2022 | Chung | H01L 29/66545 |

FOREIGN PATENT DOCUMENTS

| | | |
|---|---|---|
| JP | 2011507231 A | 3/2011 |
| JP | 2011238909 A | 11/2011 |
| KR | 20100126188 A | 12/2010 |
| KR | 20130108410 A | 10/2013 |
| KR | 20150038419 A | 4/2014 |
| WO | 2006131615 A1 | 12/2006 |
| WO | 2008069765 A1 | 6/2008 |
| WO | 2013095341 A1 | 6/2013 |
| WO | 2013095646 A1 | 6/2013 |

OTHER PUBLICATIONS

T. Ernst et al., "Ultra-dense silicon nanowires: A technology, transport and interfaces challenges insight (invited)" Microelectronic Engineering 88, 2011, pp. 1198-1202.

* cited by examiner

US 11,854,905 B2

SILICON AND SILICON GERMANIUM NANOWIRE FORMATION

PRIORITY CLAIM AND CROSS-REFERENCE

This application is a continuation of U.S. patent application Ser. No. 16/870,248, filed May 8, 2020, entitled "SILICON AND SILICON GERMANIUM NANOWIRE FORMATION," which is a continuation-in-part of and claims priority to U.S. patent application Ser. No. 16/599,307, titled "SILICON AND SILICON GERMANIUM NANOWIRE FORMATION" and filed on Oct. 11, 2019, now U.S. Pat. No. 10,943,833, issued Mar. 9, 2021, which is a continuation of and claims priority to U.S. patent application Ser. No. 16/205,419, titled "SILICON AND SILICON GERMANIUM NANOWIRE FORMATION" and filed on Nov. 30, 2018, now U.S. Pat. No. 10,699,964, issued Jun. 30, 2020, which is a continuation of and claims priority to U.S. patent application Ser. No. 15/924,350, titled "SILICON AND SILICON GERMANIUM NANOWIRE FORMATION" and filed on Mar. 19, 2018, now U.S. Pat. No. 10,163,729 issued Dec. 25, 2018, which is a continuation of and claims priority to U.S. patent application Ser. No. 15/463,326, titled "SILICON AND SILICON GERMANIUM NANOWIRE FORMATION" and filed on Mar. 20, 2017, now U.S. Pat. No. 9,935,016 issued Apr. 3, 2018, which is a continuation of and claims priority to U.S. patent application Ser. No. 14/929,504, titled "SILICON AND SILICON GERMANIUM NANOWIRE FORMATION" and filed on Nov. 2, 2015, now U.S. Pat. No. 9,634,091 issued Apr. 25, 2017, which is a divisional of and claims priority to U.S. patent application Ser. No. 13/971,239, titled "SILICON AND SILICON GERMANIUM NANOWIRE FORMATION" and filed on Aug. 20, 2013, now U.S. Pat. No. 9,184,269 issued Nov. 10, 2015, which applications are incorporated herein by reference.

BACKGROUND

A transistor, such as a FinFET transistor, comprises a source region, a drain region, and a channel region between the source region and the drain region. The transistor comprises a gate region that controls the channel region to operate the transistor. The gate region can be formed around one or more surfaces of the channel region, which provides the gate region with increased control over the channel region because the transistor can be controlled by a 3D gate area, as opposed to being controlled merely by a 2D gate area associated with a 2D planar transistor.

DETAILED DESCRIPTION

Figure 1:
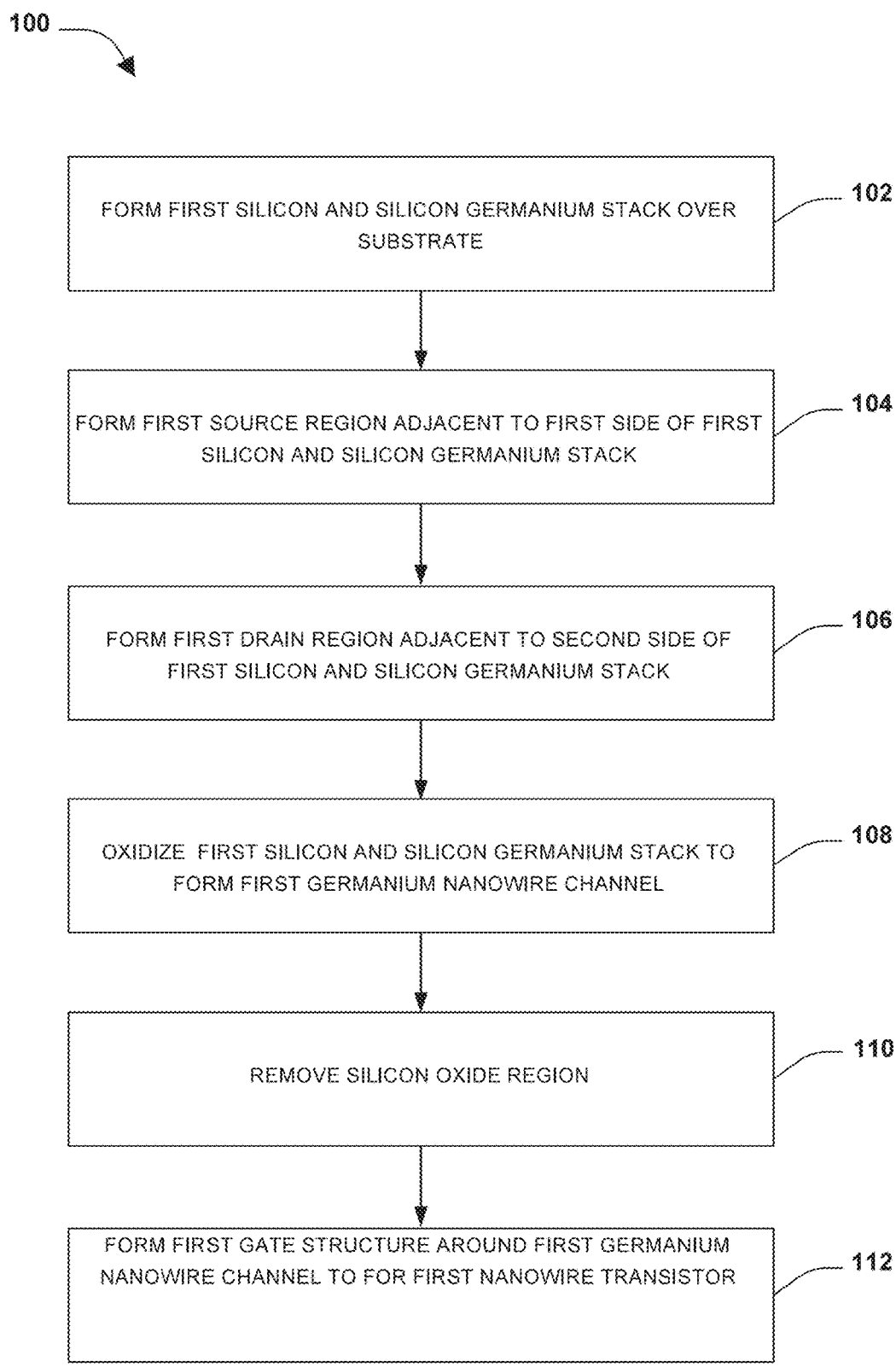
FIG. 1 is a flow diagram illustrating a method of forming a semiconductor arrangement, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more semiconductor arrangements, and one or more techniques for forming such semiconductor arrangements are provided herein. For example, a semiconductor arrangement comprises silicon and silicon germanium stacks that are used to create nano-FETs (e.g., nanostructure such as nanowire, nanosheet, the like, or a combination thereof). In some embodiments, the silicon and silicon germanium stacks create germanium channels for PMOS transistors and silicon channels for NMOS transistors. In some embodiments, the silicon and silicon germanium stacks are tapered stacks such that the width of the stack decreases when moving from the bottom to the top of the stack. In some embodiments, the silicon layers of the stack have different thicknesses and the thickness of the silicon layers decreases when moving from the bottom silicon layer to the top silicon layer. In some embodiments, the silicon germanium layers of the stack have different thicknesses and the thickness of the silicon layers increases when moving from the bottom silicon germanium layer to the top silicon germanium layer. In an example, the PMOS transistors and the NMOS transistors can be formed during a single fabrication process, such that a PMOS transistor is protected with a hard mask while an NMOS transistor is being processed, and the NMOS transistor is protected with a hard mask while the PMOS transistor is being processed.

To form a germanium nanostructure channel from the silicon and silicon germanium stack for a PMOS transistor, the silicon and silicon germanium stack is oxidized so that the silicon is transformed into a silicon oxide region such as silicon dioxide, resulting in a germanium nanostructure channel. In some embodiments, the germanium nanostructure channel includes a nanowire, a nanosheet, the like, or a combination thereof. In an embodiment, a nanostructure comprising a germanium nanowire channel has a diameter between about 5 nm to about 15 nm. In an embodiment such a diameter is between about 15 nm to about 55 nm. In an embodiment such a diameter is between about 20 nm to about 30 nm. In an embodiment such a diameter is about 6 nm. In an embodiment, a nanostructure comprising a germanium nanowire channel has a length or defines a channel length of between about 15 nm to about 55 nm, where such a channel length is measured from a source region to a drain region of the PMOS transistor. The silicon oxide region can be removed, and a gate structure can be formed around one or more surfaces, such as one, two, three, or all surfaces, of the germanium nanostructure channel.

To form a silicon nanostructure channel from a second silicon and silicon germanium stack for a NMOS transistor, a silicon germanium layer is removed from the second silicon and silicon germanium stack to form a silicon nanostructure channel. In some embodiments, the silicon nanostructure channel includes a nanowire, a nanosheet, the like, or a combination thereof. In an embodiment, a nanostructure comprising a silicon nanowire channel has a diameter between about 5 nm to about 15 nm. In an embodiment such a diameter is between about 15 nm to about 55 nm. In an embodiment such a diameter is between about 20 nm to about 30 nm. In an embodiment such a diameter is about 6 nm. In an embodiment, the silicon nanowire channel has a diameter that is equal to or substantially equal to a diameter of the germanium nanowire channel. In an embodiment, the silicon nanowire channel has a diameter that is larger than a diameter of the germanium nanowire channel. In an embodiment, the silicon nanowire channel has a diameter that is between about 2 nm to about 3 nm larger than a diameter of the germanium nanowire channel. In an embodiment, the silicon nanowire channel has a diameter that is between about 20% to about 40% larger than a diameter of the germanium nanowire channel. In an embodiment, a nanostructure comprising a silicon nanowire channel has a length or defines a channel length of between about 15 nm to about 55 nm, where such a channel length is measured from a source region to a drain region of the NMOS transistor.

In this way, PMOS transistors, comprising germanium nanostructure channels, and NMOS transistors, comprising silicon nanostructure channels, can be formed within the semiconductor arrangement from silicon and silicon germanium stacks. In an example, the semiconductor arrangement has improved current, such as between about 14% to about 16% improved current for NMOS transistors and between about 13% to about 15% improved current for PMOS transistors. In an example, the semiconductor arrangement has reduced short channel effect, such as between about 6% to about 8% reduction for NMOS transistors and between about 4% to about 6% reduction for PMOS transistors.

In an embodiment, a gate dielectric layer is formed around at least one of the silicon nanostructure channel or the germanium nanostructure channel. In an embodiment, the gate dielectric layer comprises at least one of an interfacial layer (IL) or a high-k dielectric layer (HK layer). In an embodiment, the IL has a thickness between about 5 A to about 15 A. In an embodiment, the HK layer has a thickness between about 5 A to about 20 A. In an embodiment, at least one of the thickness of the IL around the silicon nanostructure channel or the thickness of the HK layer around the silicon nanostructure channel is less than at least one of the thickness of the IL around the germanium nanostructure channel or the thickness of the HK layer around the germanium nanostructure channel. In an embodiment, at least one of the thickness of the IL around the silicon nanostructure channel or the thickness of the HK layer around the silicon nanostructure channel is between about 5% to about 15% less than at least one of the thickness of the IL around the germanium nanostructure channel or the thickness of the HK layer around the germanium nanostructure channel.

A method 100 of forming a semiconductor arrangement is illustrated in FIG. 1, and one or more semiconductor arrangements formed by such a methodology are illustrated in FIGS. 2-10. A semiconductor arrangement 250 comprises a substrate 202, as illustrated in embodiment 200 of FIG. 2. In an example, the substrate 202 comprises silicon, and the substrate 202 is formed according to a FinFET arrangement comprising one more silicon fins separated by isolation structures 204, such as shallow trench isolation (STI). For example, a first fin 202*a*, a second fin 202*b*, a third fin 202*c*, and a fourth fin 202*d* are formed from the substrate 202. In an example, an isolation structure has a depth between about 60 nm to about 120 nm. In an example, a recessed space, between about 50 nm to about 110 nm, is formed into the substrate 202 for formation of silicon and silicon germanium, such as through an epi growth technique, such as chemical vapor deposition (CVD), atomic layer deposition (ALD), vapor phase epitaxy (VPE), molecular beam epitaxy (MBE), or the like, for a silicon and silicon germanium stack where an epi thickness of silicon germanium is between about 5 nm to about 15 nm and an epi thickness for silicon is between about 5 nm to about 15 nm.

Figure 2:
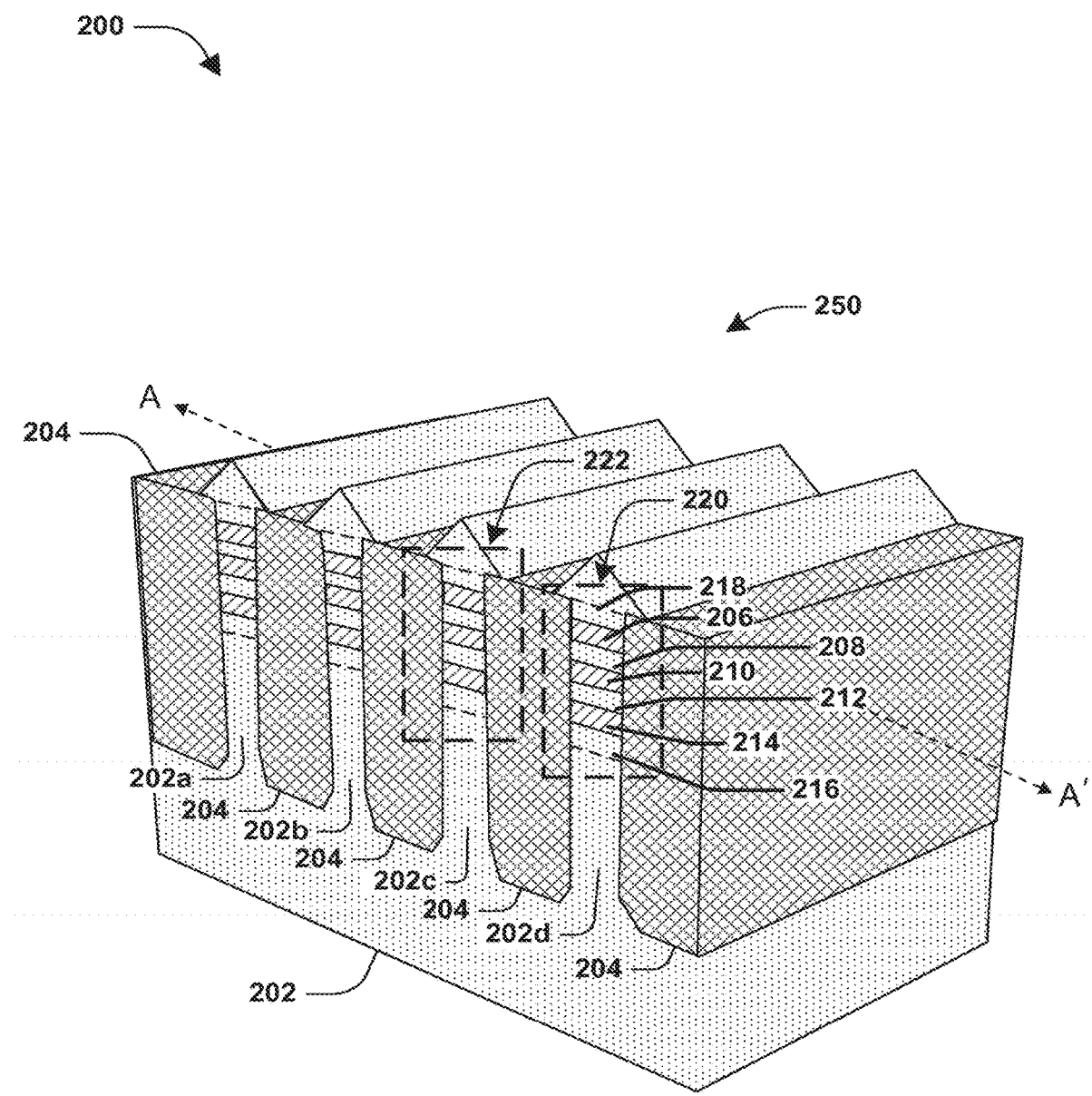
FIG. 2 is an illustration of a silicon and silicon germanium stack, according to some embodiments.

At 102, a silicon and silicon germanium stack is formed over the substrate 202, as illustrated in embodiment 200 of FIG. 2. For example, a first silicon and silicon germanium stack 220, a second silicon and silicon germanium stack 222, or other silicon and silicon germanium stacks not illustrated or identified are formed over the substrate 202. The first silicon and silicon germanium stack 220 comprises one or more silicon layers and one or more silicon germanium layers. For example, the first silicon and silicon germanium stack 220 comprises a first silicon layer 218, a first silicon germanium layer 206, a second silicon layer 208, a second silicon germanium layer 210, a third silicon layer 212, a third silicon germanium layer 214, and a fourth silicon layer 216. It is appreciated that any number of silicon layers or silicon germanium layers can be formed. In an example, a silicon germanium layer comprises between about 20% to about 50% germanium.

Figure 3:
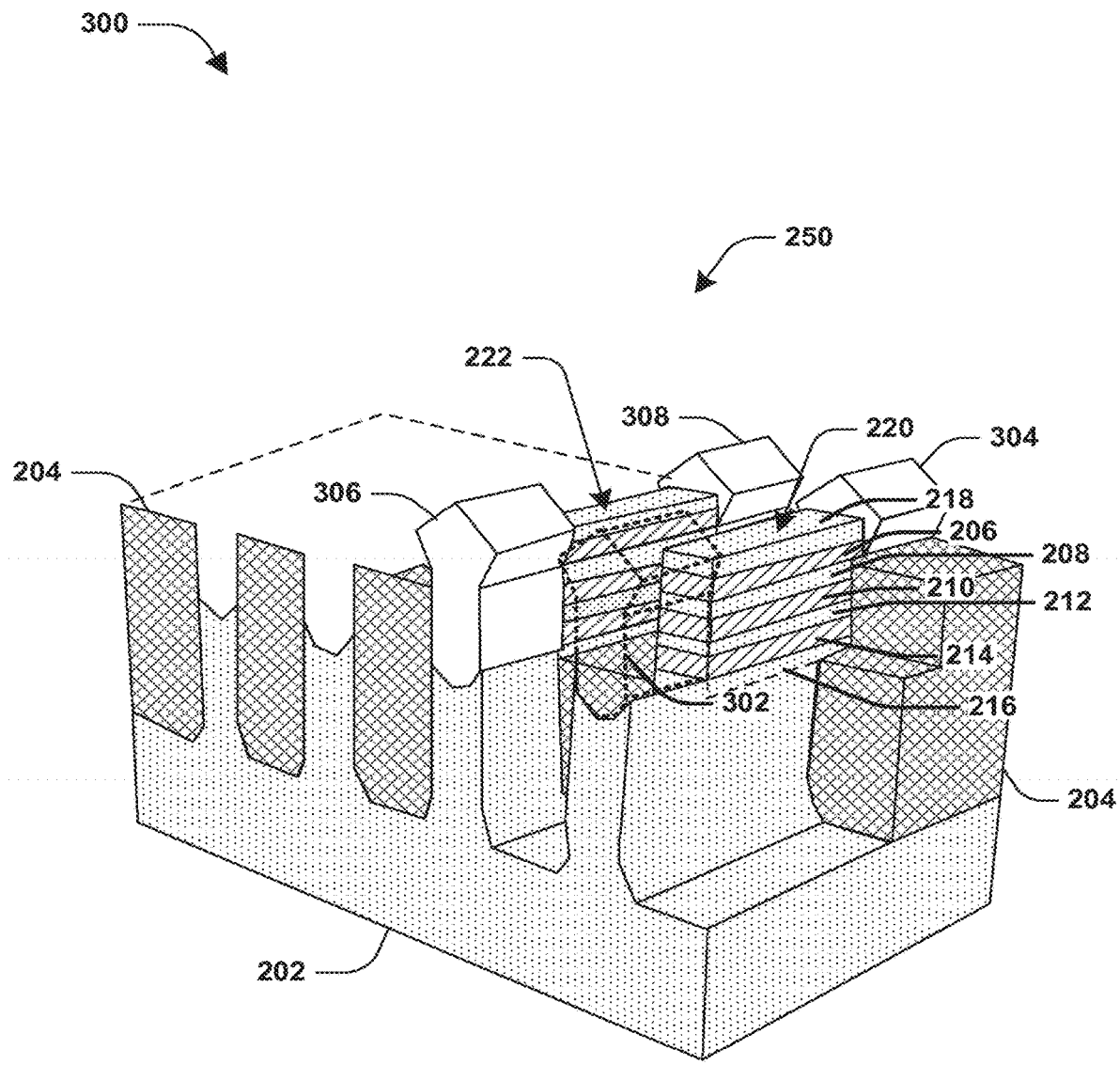
FIG. 3 is an illustration of a first source region and a first drain region, according to some embodiments.

At 104, a first source region 302 is formed adjacent to a first side of the first silicon and silicon germanium stack 220, as illustrated in embodiment 300 of FIG. 3. It is appreciated that the first source region 302 is illustrated by dashed lines for illustrative purposes so that other portions of the semiconductor arrangement 250 are visible or apparent. At 106, a first drain region 304 is formed adjacent to a second side of the first silicon and silicon germanium stack 220, as illustrated in embodiment 300 of FIG. 3. In an example of forming the first source region 302 and the first drain region 304, a sacrificial gate is formed, such as a polygate formed by a patterning technique, over the substrate 202 and over the first silicon and silicon germanium stack 220. Spacers are formed, such as by a deposition technique, on sidewalls of the of the semiconductor arrangement 250. Portions of the first silicon and silicon germanium stack 220, corresponding to the first source region 302 and the first drain region 304, are removed, such as through an etching technique. Source and drain material is formed within the first source region 302 and the first drain region 304, such as through an epitaxial growth technique, to create a first source and a first drain for a first nanostructure transistor. Other source regions, such as a second source region 306, and drain regions, such as a second drain region 308, are formed for other nanostructure transistors that are to be formed for the semiconductor arrangement 250.

Figure 4:
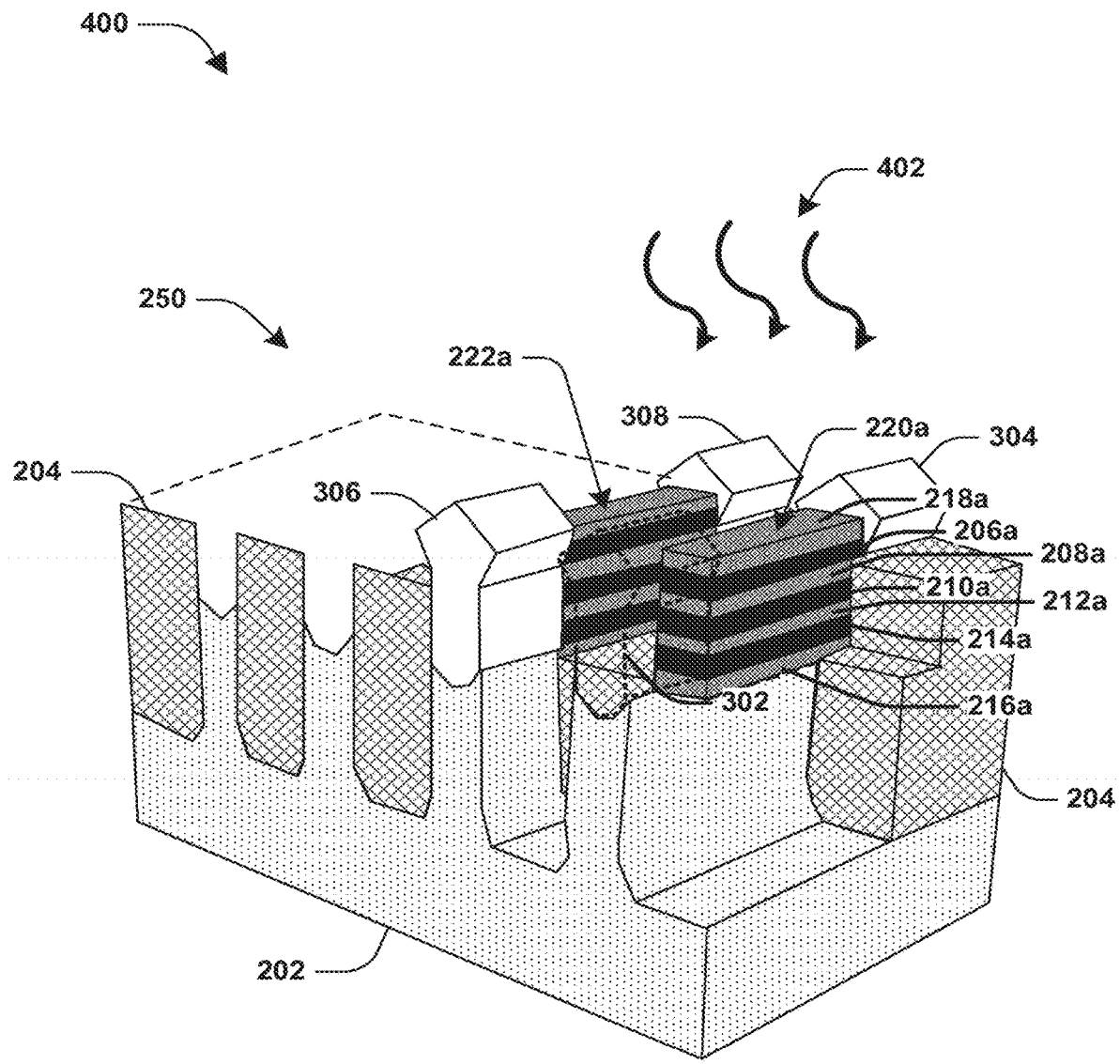
FIG. 4 is an illustration of oxidizing a silicon and silicon germanium stack, according to some embodiments.

At 108, the first silicon and silicon germanium stack 220, illustrated in embodiment 300 of FIG. 3, is oxidized 402 to form a first oxidized stack 220a, as illustrated in embodiment 400 of FIG. 4. In some embodiments, the first silicon and silicon germanium stack 220 or other silicon and silicon germanium stacks are oxidized 402 to form germanium nanostructure channels including a germanium nanowire channel, a germanium nanosheet channel, the like, or a combination thereof. In an example, the second silicon and silicon germanium stack 222, illustrated in embodiment 300 of FIG. 3, is oxidized 402 to form a second oxidized stack 222a, as illustrated in embodiment 400 of FIG. 4. In an example, the oxidizing 402 comprises removing a sacrificial gate, not illustrated, over the first silicon and silicon germanium stack 220 to expose the first silicon and silicon germanium stack 220 to ambient oxygen. Oxidizing 402 the first silicon and silicon germanium stack 220 transforms silicon, such as silicon of a silicon layer or silicon of a silicon germanium layer, to silicon oxide such as silicon dioxide. For example, the first silicon layer 218 is transformed to a first silicon oxide region 218a. Silicon of the first silicon germanium layer 206 is transformed to silicon oxide, resulting in a first germanium nanowire channel 206a between the first source region 302 and the first drain region 304. The second silicon layer 208 is transformed to a second silicon oxide region 208a. Silicon of the second silicon germanium layer 210 is transformed into silicon oxide, resulting in a second germanium nanowire channel 210a between the first source region 302 and the first drain region 304. The third silicon layer 212 is transformed to a third silicon oxide region 212a. Silicon of the third silicon germanium layer 214 is transformed into silicon oxide, resulting in a third germanium nanowire channel 214a between the first source region 302 and the first drain region 304. The fourth silicon layer 216 is transformed to a fourth silicon oxide region 216a. In an example, remaining germanium of a silicon and germanium layer is condensed into a germanium nanowire channel. In an example, the first germanium nanowire channel 206a and the second germanium nanowire channel 210a are formed such that a space of about 5 nm or greater is between the first germanium nanowire channel 206a and the second germanium nanowire channel 210a so that interfacial layer material, high-k dielectric layer material, or titanium nitride capping layer material can be formed around the first germanium nanowire channel 206a and the second germanium nanowire channel 210a. In this way, the first silicon and silicon germanium stack 220 or other silicon and silicon germanium stacks are oxidized 402 to form germanium nanowire channels.

Figure 5:
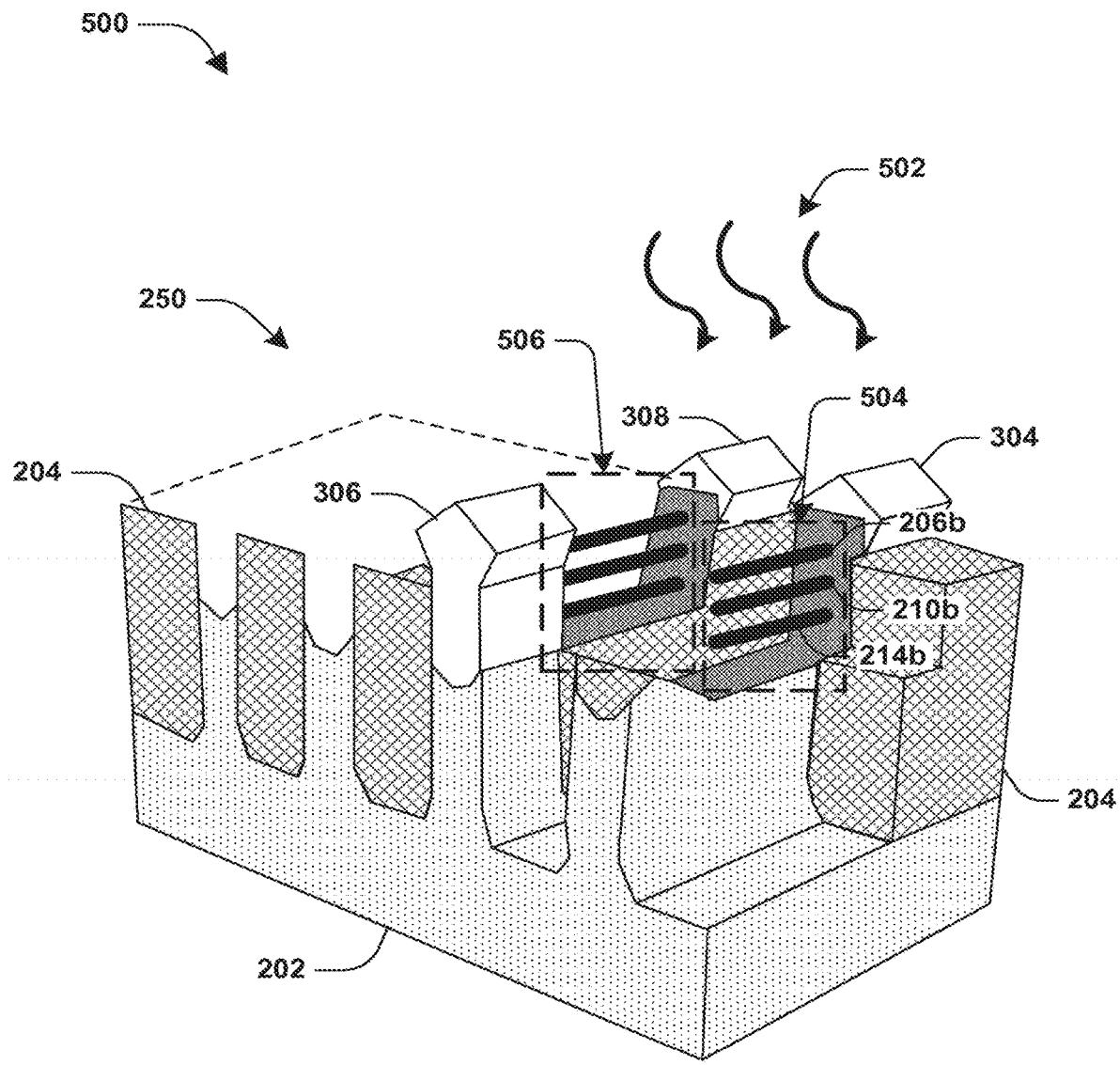
FIG. 5 is an illustration of a removing silicon oxide region, according to some embodiments.

At 110, silicon oxide, such as a silicon oxide region, is removed, as illustrated in embodiment 500 of FIG. 5. That is, silicon oxide is removed to expose the germanium nanostructure channels, and to form a region within which a gate structure can be formed. In an example, the first silicon oxide region 218a, the second silicon oxide region 208a, the third silicon oxide region 212a, the fourth silicon oxide region 216a, or other silicon oxide, such as silicon oxide formed from oxidizing 402 silicon germanium layers, are removed by an etching process 502. Germanium nanostructure channels, such as the first germanium nanowire channel 206a, the second germanium nanowire channel 210a, the third germanium nanowire channel 214a, or other germanium nanowire channels, can be formed according to various configurations, shapes, or sizes, such as a first germanium nanowire channel 206b having a cylindrical configuration, a second germanium nanowire channel 210b having the cylindrical configuration, and a third germanium nanowire channel 214b having the cylindrical configuration. In this way, source regions, drain regions, and germanium nanowire channels are formed for a first nanostructure transistor 504, a second nanostructure transistor 506, or other PMOS nanostructure transistors. The cylindrical configurations of the nanostructure channels can be any cylindrical configuration, such as a circular cylinder, an elliptic cylinder, or the like.

Figure 6:
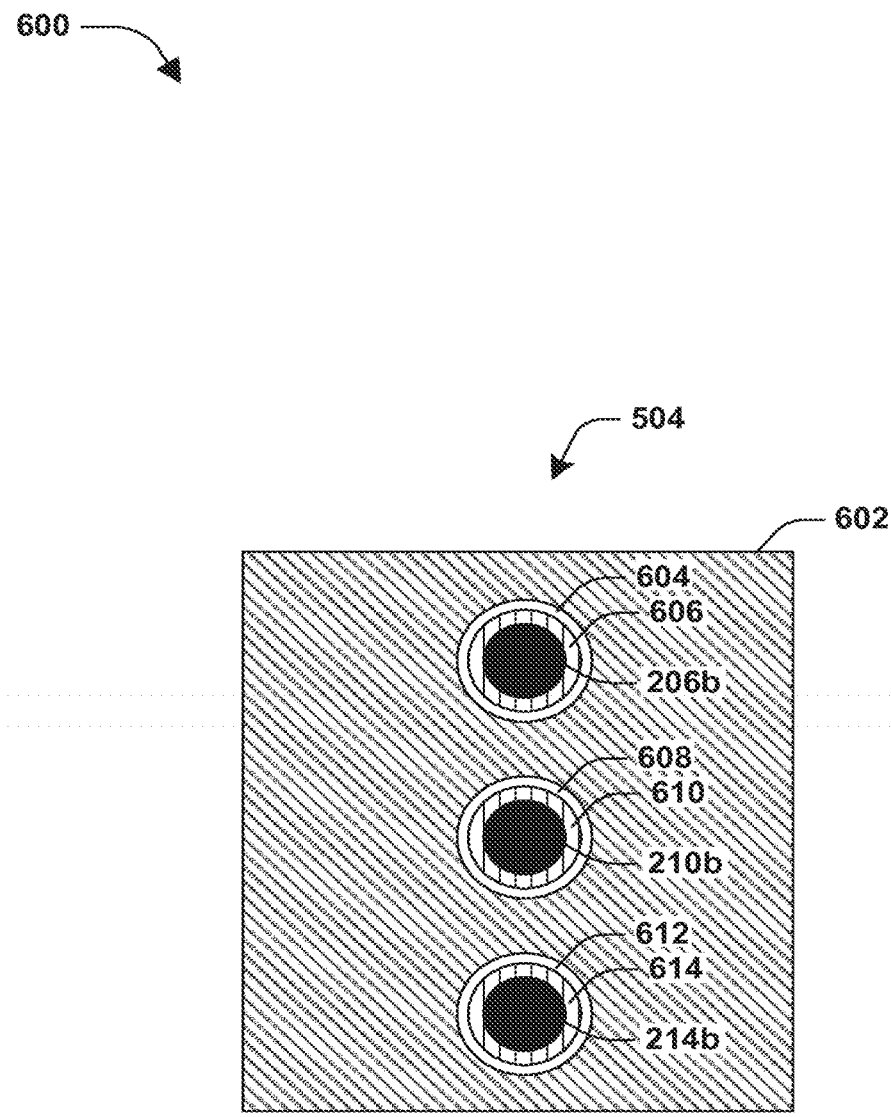
FIG. 6 is an illustration of a first set of nanostructure field-effect transistors (nano-FETs) comprising a gate structure formed according to a gate-all-around structure, according to some embodiments.
Figure 7:
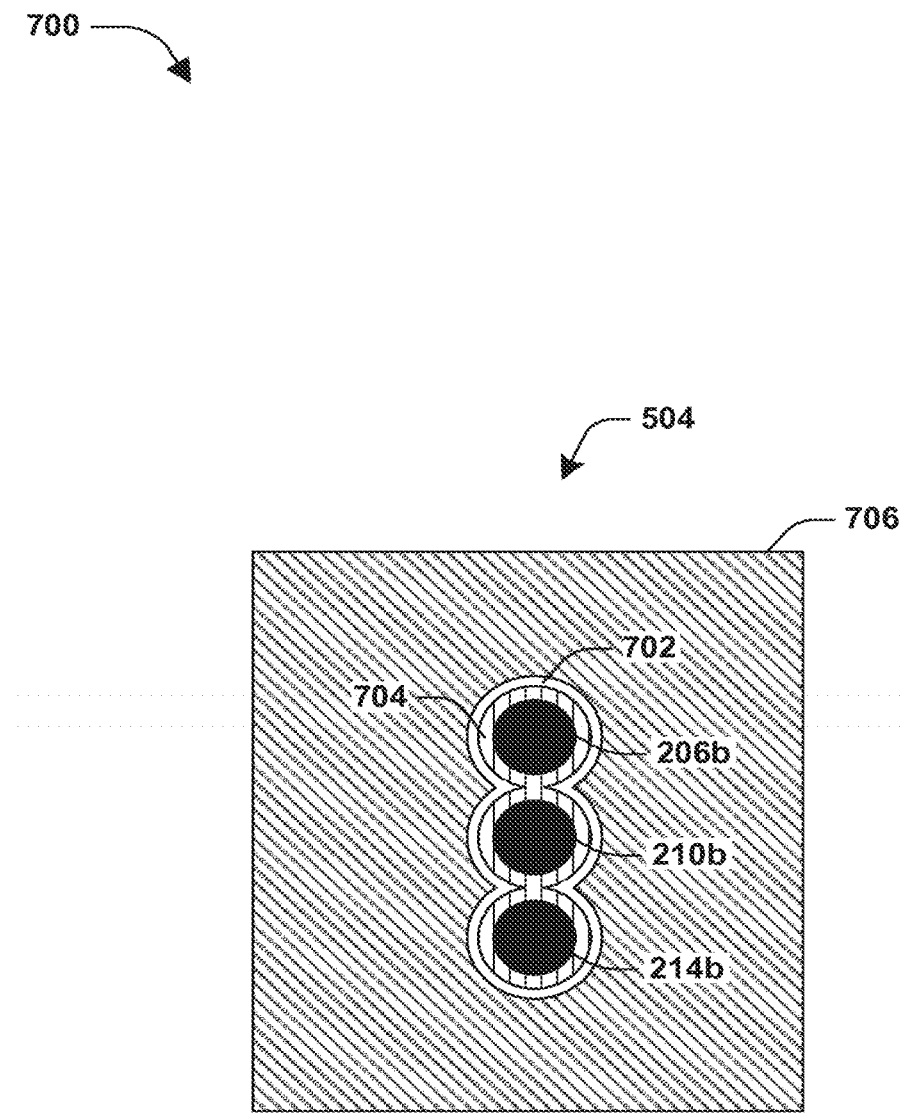
FIG. 7 is an illustration of a first set of nano-FETs, according to some embodiments.

In an example, a first interfacial layer 606 is formed around the first germanium nanowire channel 206b, a second interfacial layer 610 is formed around the second germanium nanowire channel 210b, and a third interfacial layer 614 is formed around the third germanium nanowire channel 214b, as illustrated in embodiment 600 of FIG. 6. An interfacial layer is formed to improve adhesion between materials or layers. In an example, an interfacial layer comprises nitride, oxide, or other suitable material. In an example, a first high-k dielectric layer 604 is formed around the first interfacial layer 606, a second high-k dielectric layer 608 is formed around the second interfacial layer 610, and a third high-k dielectric layer 612 is formed around the third interfacial layer 614, as illustrated in embodiment 600 of FIG. 6. In an example, a titanium nitride capping layer is formed around one or more high-k dielectric layers. In an example, a barrier, such as TaN or TiN is formed around the titanium nitride capping layer.

At 112, a first gate structure 602 is formed around the first germanium nanowire channel 206b, to form the first nanowire transistors 504, as illustrated in embodiment 600 of FIG. 6. In an example, the first gate structure 602 comprises TiN or W, alone or in combination. In the illustrated example, given that there are three germanium nanowire channels, the first gate structure is also formed around the second germanium nanowire channel 210b, and the third germanium nanowire channel 214b. In an example, the first gate structure 602 is formed as a gate-all-around structure surrounding the germanium nanowire channels to increase gate control, as illustrated in embodiment 600 of FIG. 6. In another example, a first gate structure 706 is formed around one or more surfaces of the germanium nanowire channels, as illustrated in embodiment 700 of FIG. 7. For example, a first interfacial layer 704 is formed around the first germanium nanowire channel 206b, the second germanium nanowire channel 210b, and the third germanium nanowire channel 214b. A high-k dielectric layer 702 is formed around the first interfacial layer 704. The first gate structure 706 is formed around the high-k dielectric layer 702. In this way, the first gate structure 706 is formed around some, but not all, surfaces of the germanium nanowire channels, which can increase channel density within the first nanowire transistor 504. The first nanowire transistor 504, the second nanowire transistor 506, or other nanowire transistor within the semiconductor arrangement 250 are formed as PMOS transistors, where germanium nanowire channels are formed as P channels for the PMOS transistors. In an example, a first interlayer dielectric is formed over one or more source regions and a second interlayer dielectric is formed over one or more drain regions. In this way, gate structures are formed between the first interlayer dielectric and the second interlayer dielectric. In an example, a blocking layer is formed below the germanium nanowire channels to mitigate punch through or leakage.

In an example, one or more NMOS transistors are formed within the semiconductor arrangement 250 before, during, and/or after formation of the one or more PMOS transistors as a single fabrication process because formation of NMOS transistors and formation of PMOS transistors both utilize silicon and silicon germanium stacks. For example, during at least some of the processes of forming the PMOS transistors, NMOS portion of the semiconductor arrangement 250 are protected by a hard mask. During at least some of the processes of forming the NMOS transistors, PMOS portions of the semiconductor are protected by a hard mask.

Figure 8:
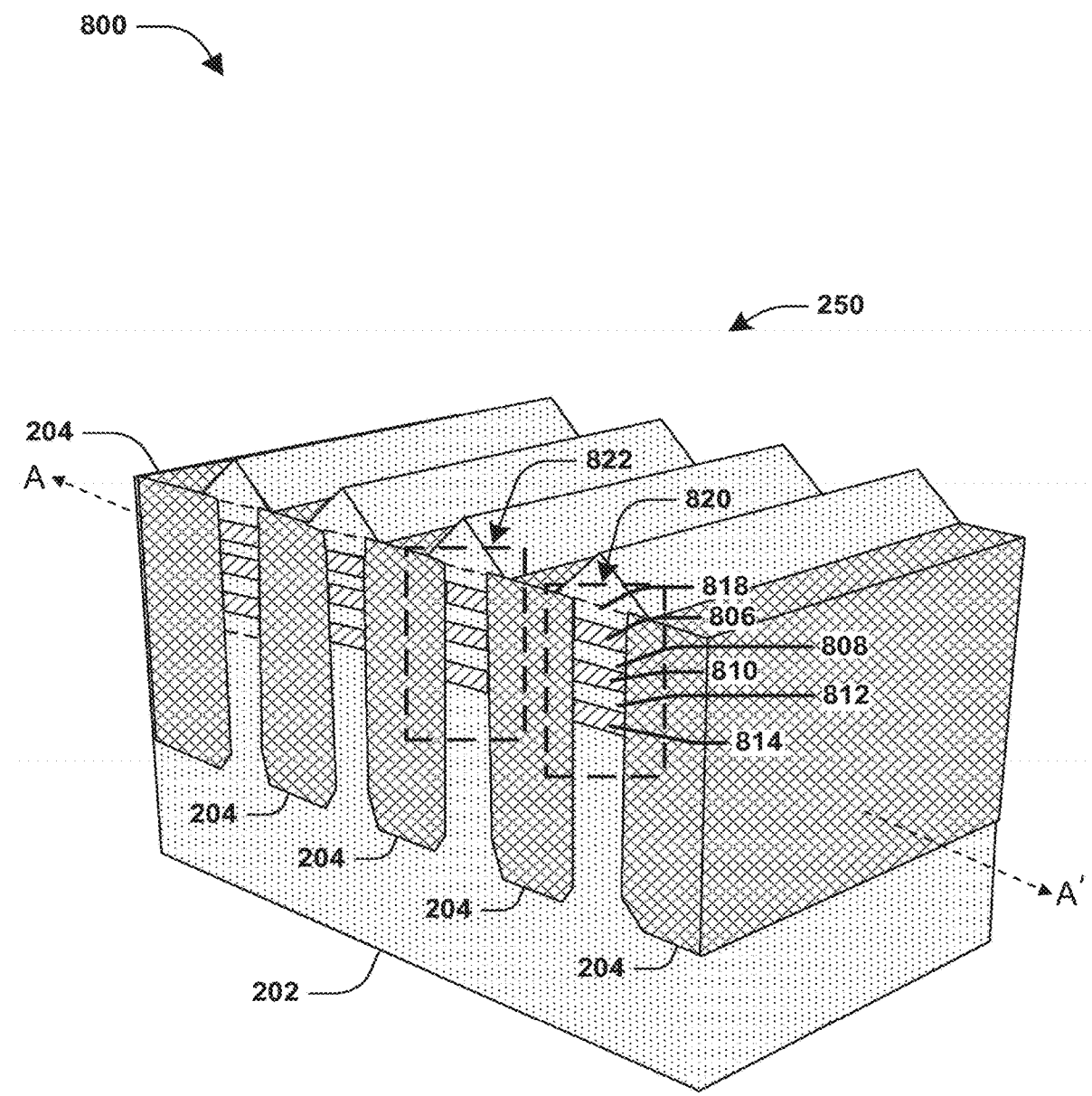
FIG. 8 is an illustration of a silicon and silicon germanium stack, according to some embodiments.
Figure 9:
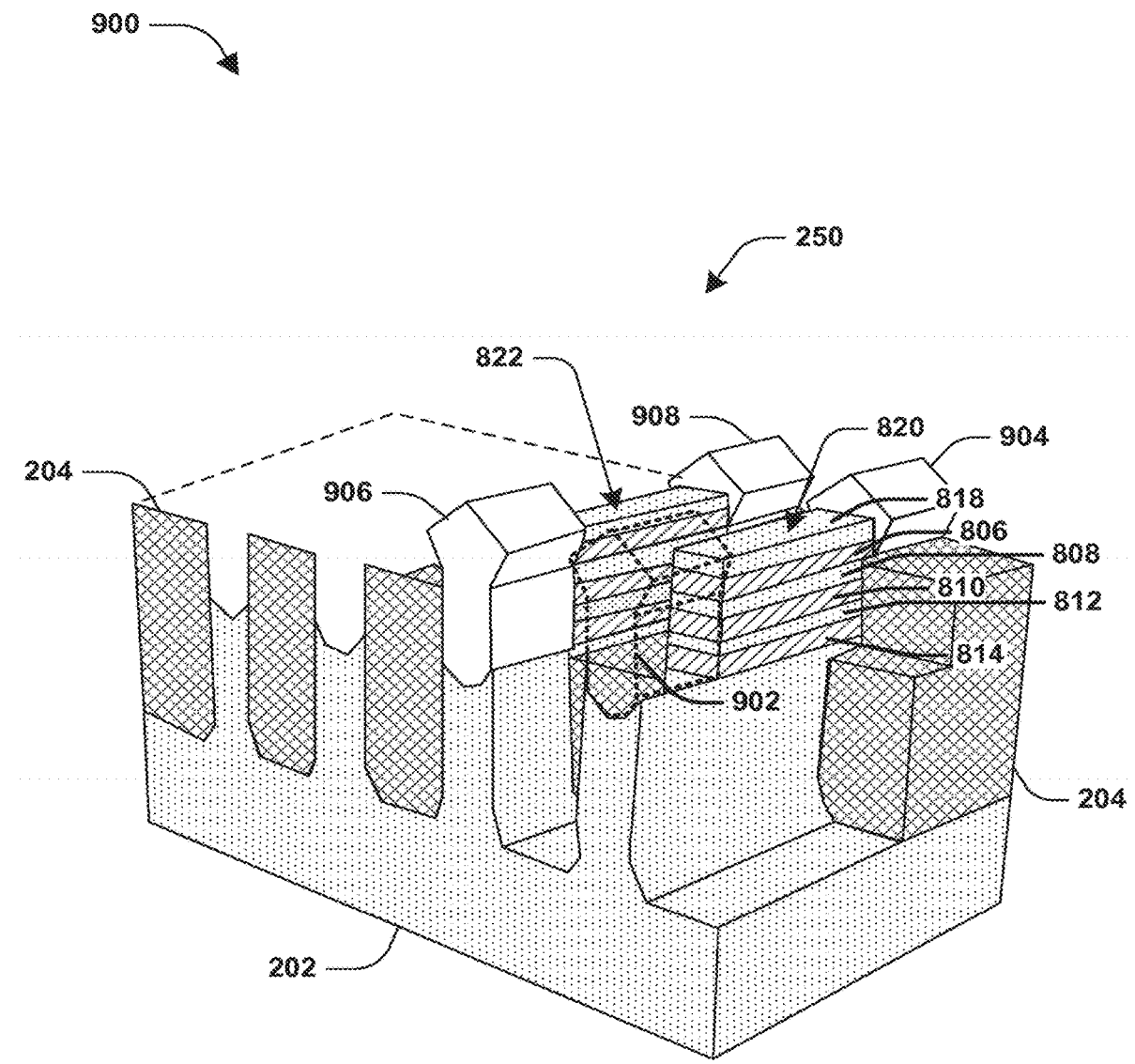
FIG. 9 is an illustration of a third source region and a third drain region, according to some embodiments.
Figure 10:
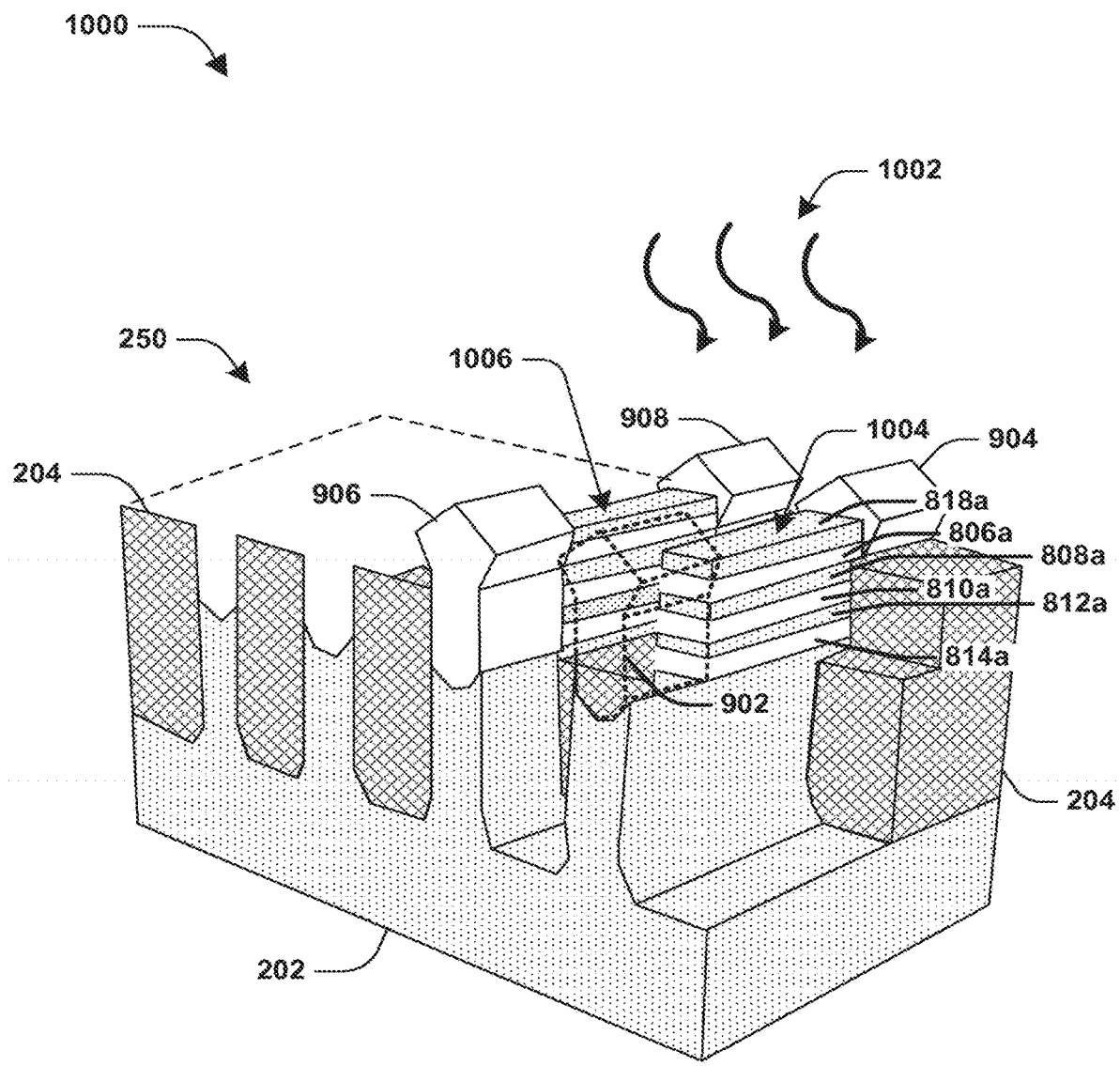
FIG. 10 is an illustration of a third set of nano-FETs, according to some embodiments.

FIGS. 8-10 illustrate embodiments of forming one or more NMOS nanostructure transistors within the semiconductor arrangement 250 utilizing silicon and silicon germanium stacks. In an example, the first nanostructure transistor 504, the second nanostructure transistor 506, or other nanostructure transistors formed as PMOS transistors within the semiconductor arrangement 250 are protected by a hard mask during formation of the one or more NMOS transistors.

In an example, a third silicon and silicon germanium stack 820, a fourth silicon and silicon germanium stack 822, or other silicon and silicon germanium stacks are formed over the substrate 202, as illustrated in embodiment 800 of FIG. 8. The third silicon and silicon germanium stack 820 comprises one or more silicon layers and one or more silicon germanium layers. For example, the third silicon and silicon germanium stack 820 comprises a first silicon layer 818, a first silicon germanium layer 806, a second silicon layer 808, a second silicon germanium layer 810, a third silicon layer 812, and a third silicon germanium layer 814. It is appreciated that any number of silicon layers or silicon germanium layers can be formed.

A third source region 902 is formed on a first side of the third silicon and silicon germanium stack 820 and a third drain region 904 is formed on a second side of the third silicon and silicon germanium stack 820, as illustrated in embodiment 900 of FIG. 9. In an example, a fourth source region 906, a fourth drain region 908, or other source and drain regions are formed adjacent to silicon and silicon germanium stacks. Silicon germanium layers within the silicon and silicon germanium stacks are removed to form silicon nanostructure channels between source regions and drain regions, as illustrated in embodiment 1000 of FIG. 10. In some embodiments, the silicon germanium layers within the silicon and silicon germanium stacks are removed to form silicon nanostructure channels including a silicon nanowire channel, a silicon nanosheet channel, the like, or a combination thereof. In an example, the first silicon germanium layer 806 is removed to form a first space 806a between a first silicon nanowire channel 818a and a second silicon nanowire channel 808a, the second silicon germanium layer 810 is removed to form a second space 810a between the second silicon nanowire channel 808a and a third silicon nanowire channel 812a, and the third silicon germanium layer 814 is removed to form a third space 814a between the third silicon nanowire channel 812a and the substrate 202. In an example, a chemical etch 1002 is performed to remove the silicon germanium layers from the silicon and silicon germanium stacks. In an example, the silicon nanowire channels can be formed according to various configurations, shapes, or sizes, such as cylindrical shapes. The cylindrical shapes of the nanostructure channels can be any cylindrical configuration, such as a circular cylinder, an elliptic cylinder, or the like. For example, an oxidation technique or a hydrogen annealing technique is performed to smooth the silicon nanowire channels. In an example, gate structures are formed around the silicon nanowire channels to form a nanostructure nanowire transistor 1004, a fourth nanostructure transistor 1006, or other NMOS nanostructure transistors, not illustrated.

In an example, an interfacial layer is formed around one or more of the silicon nanostructure channels. In an example, a high-k dielectric layer is formed around one or more of the silicon nanowire channels or around an interfacial layer if present. A gate structure may be formed as a gate-all-around structure, or around fewer than all sides of a silicon nanowire channel. In an example, the gate structure comprises TiN or W, alone or in combination. Formation of one or more of such gate structures, interfacial layers or high-k dielectric layers is in accordance with that described above with regard to formation of a PMOS transistor, according to some embodiments. In an example, a titanium nitride capping layer is formed around one or more high-k dielectric layers. In an example, a barrier, such as TaN, TiAlC, TaAlC, or TiAl is formed around the titanium nitride capping layer. In an example, gate height for a PMOS nanostructure transistor is less than a gate height for an NMOS nanostructure transistor. In this way, NMOS transistors and PMOS transistors are formed within the semiconductor arrangement 250 utilizing silicon and silicon germanium stacks.

Figure 11:
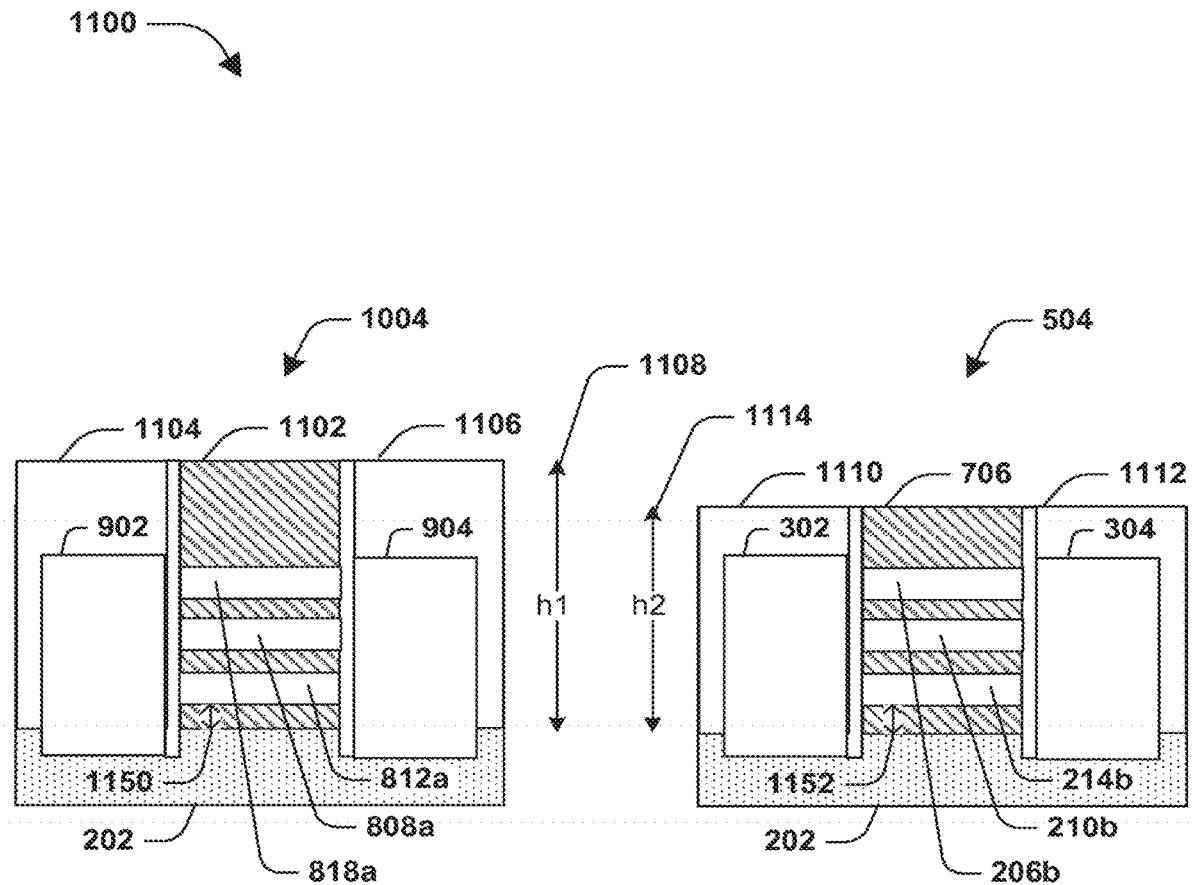
FIG. 11 is an illustration of an NMOS gate height and a PMOS gate height, according to some embodiments.

FIG. 11 illustrates an embodiment 1100 of an NMOS gate height 1108 and a PMOS gate height 1114. A third nanostructure transistor 1004 comprises an NMOS transistor. The third nanostructure transistor 1004 comprises a third source region 902 and a third drain region 904 formed over a substrate 202. The third nanostructure transistor 1004 comprises a first silicon nanowire channel 818a, a second silicon nanowire channel 808a, and a third silicon nanowire channel 812a formed between the third source region 902 and the third drain region 904. A first interlayer dielectric 1104 is formed over the third source region 902, and a second interlayer dielectric 1106 is formed over the third drain region 904. A gate structure 1102 is formed around the first silicon nanowire channel 818a, the second silicon nanowire channel 808a, and the third silicon nanowire channel 812a. The gate structure 1102 has an NMOS gate height 1108.

A first nanostructure transistor 504 comprises a PMOS transistor. The first nanowire transistor 504 comprises a first source region 302 and a first drain region 304 formed over the substrate 202. The first nanostructure transistor 504 comprises a first germanium nanowire channel 206b, a second germanium nanowire channel 210b, and a third germanium nanowire channel 214b formed between the first source region 302 and the first drain region 304. A third interlayer dielectric 1110 is formed over the first source region 302, and a fourth interlayer dielectric 1112 is formed over the first drain region 304. A first gate structure 706 is formed around the first germanium nanowire channel 206b, the second germanium nanowire channel 210b, and the third germanium nanowire channel 214b. The first gate structure 706 has a PMOS gate height 1114. In an example, the PMOS gate height 1114 is less than the NMOS gate height 1108. For example, the PMOS gate height 1114 is less than the NMOS gate height 1108 due to double metal gate CMP used for PMOS.

In an embodiment, a silicon nanostructure to substrate distance 1150 is the same as a germanium nanostructure to substrate distance 1152, where the silicon nanostructure to substrate distance 1150 is not limited to being relative to the third silicon nanowire channel 812a and the germanium nanostructure to substrate distance 1152 is not limited to being relative to the third germanium nanowire channel 214b. In an embodiment, the silicon nanostructure to substrate distance 1150 is larger than the germanium nanostructure to substrate distance 1152. In an embodiment the silicon nanostructure to substrate distance 1150 is between about 1 nm to about 10 nm larger than the germanium nanostructure to substrate distance 1152. In an embodiment, at least one of thermal annealing, gate dielectric formation, or threshold voltage adjustment associated with forming a PMOS transistor comprising a germanium nanowire channel can be performed concurrently or substantially concurrently with at least one of thermal annealing, gate dielectric formation, or threshold voltage adjustment associated with forming a NMOS transistor comprising a silicon nanowire channel.

Figure 12:
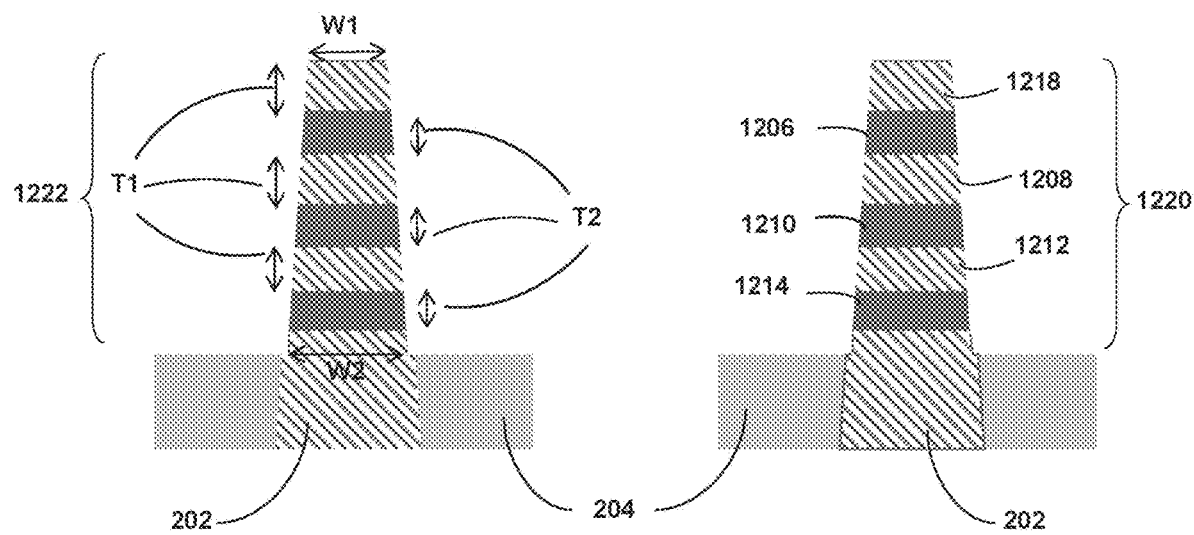
FIGS. 12 through 14 are cross-sectional views of intermediate stages in the manufacturing of nano-FETs, in accordance with some embodiments.
Figure 13:
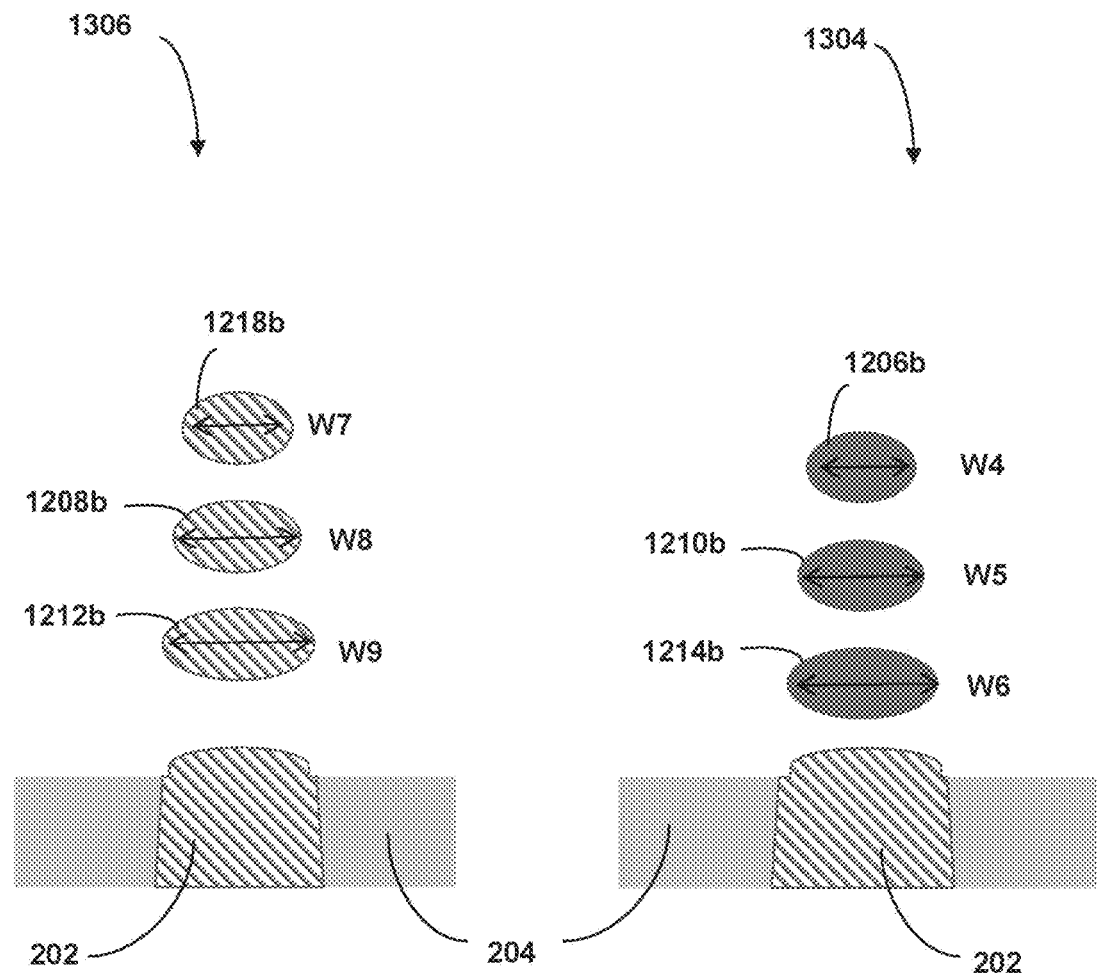
Figure 14:
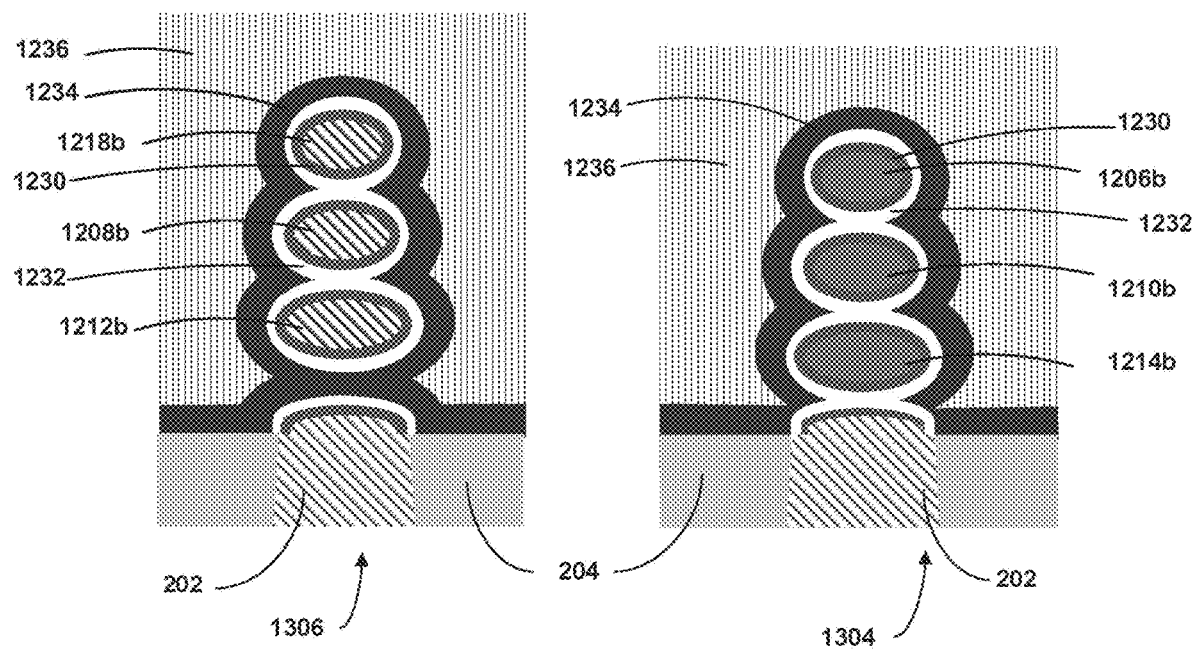

FIGS. 12 through 14 are cross-sectional views of intermediate stages in the manufacturing of nano-FETs (e.g., nanostructure such as nanowire, nanosheet, the like, or a combination thereof), in accordance with some embodiments. FIGS. 12 through 14 illustrate reference cross-section A-A' illustrated in FIGS. 2 and 8. Cross-section A-A' in FIGS. 2 and 8 are each along a longitudinal axis of a gate electrode and in a direction, for example, perpendicular to the direction of current flow between the epitaxial source/drain regions of the nano-FET.

The embodiment in FIGS. 12 through 14 is similar to the previous embodiments except that this embodiment includes tapered silicon and silicon germanium stacks. In this embodiment, the silicon and silicon germanium stacks are tapered stacks such that the width of the stack decreases when moving from the bottom to the top of the stacks. Details regarding this embodiment that are similar to those for the previously described embodiment will not be repeated herein.

In FIG. 12, a silicon and silicon germanium stack 1220, a silicon and silicon germanium stack 1222, or other silicon and silicon germanium stacks are formed over the substrate/fins 202, as illustrated. The silicon and silicon germanium stacks 1220 and 1222 comprise one or more silicon layers and one or more silicon germanium layers. For example, the silicon and silicon germanium stack 1220 comprises a first silicon layer 1218, a first silicon germanium layer 1206, a second silicon layer 1208, a second silicon germanium layer 1210, a third silicon layer 1212, and a third silicon germanium layer 1214. It is appreciated that any number of silicon layers or silicon germanium layers can be formed.

In the embodiment of FIGS. 12 through 15, the silicon and silicon germanium stacks 1220 and 1222 are tapered stacks such that the width of the stack decreases when moving from the bottom to the top of the stacks. Each of the stacks 1220 and 1222 may have widths at the top of the stack of W1, with W1 being in a range from about 3 nm to about 15 nm, such as about 7 nm. Each of the stacks 1220 and 1222 may have widths at the bottom of the stack of W2, with W2 being in a range from about 6 nm to about 20 nm, such as about 10 nm. The widths W1 and W2 are measured in a direction parallel to a major surface of the substrate 202.

Further, in the embodiment of FIGS. 12 through 15, the silicon germanium layers 1206, 1210, and 1214 each have a same thickness T1 in a range from about 5 nm to about 30 nm, such as about 15 nm, and the silicon layers 1218, 1208, and 1212 each have a same thickness T2 in a range from about 5 nm to about 30 nm, such as about 15 nm. The thicknesses T1 and T2 are measured in a direction perpendicular to a major surface of the substrate 202.

In this embodiment, the silicon and silicon germanium stack 1220 will be subsequently utilized in a PMOS nanostructure transistor, and the silicon and silicon germanium stack 1222 will be subsequently utilized in an NMOS nanostructure transistor. In some embodiments, the nanostructure transistors include one or more nanostructure channels including a nanowire, a nanosheet, the like, or a combination thereof.

FIG. 13 illustrates an intermediate stage of processing with the nanostructure channels formed. The processing between FIGS. 12 and 13 is similar to that described in FIGS. 2 through 5 and FIGS. 8-10 above and the description of forming this intermediate stage of processing is not repeated herein.

In FIG. 13, the silicon layers of the silicon and silicon germanium stack 1220 are removed to expose the germanium nanostructure channels, and to form a region within which a gate structure can be formed. In an example, the first silicon layer 1218, the second silicon layer 1208, and the third silicon layer 1212, or other silicon layer are removed by an etching process. In some embodiments, the etching process may be a wet etching process including etchants such as, tetramethylammonium hydroxide (TMAH), ammonium hydroxide (NH$_4$OH), or the like. Germanium nanostructure channels can be formed according to various configurations, shapes, or sizes, such as a first germanium nanostructure channel 1206b having a cylindrical configuration, a second germanium nanostructure channel 1210b having the cylindrical configuration, and a third germanium nanostructure channel 1214b having the cylindrical configuration. In this way, source regions, drain regions, and germanium nanostructure channels are formed for a first PMOS nanostructure transistor 1304 or other PMOS nanostructure transistor. The cylindrical configurations of the nanostructure channels can be any cylindrical configuration, such as a circular cylinder, an elliptic cylinder, or the like.

In some embodiments, the first germanium nanostructure channel 1206b has a width W4, the second germanium nanostructure channel 1210b has a width W5, and the third germanium nanostructure channel 1214b has a width W6, with each of the widths being measured in a direction parallel to a major surface of the substrate 202. In some embodiments, the width W4 is less than W5 and the width W5 is less than W6.

Further in FIG. 13, the silicon germanium layers of the silicon and silicon germanium stack 1222 are removed to expose the silicon nanostructure channels, and to form a region within which a gate structure can be formed. In an example, the first silicon germanium layer 1206, the second silicon germanium layer 1210, and the third silicon germanium layer 1214, or other silicon germanium layer are removed by an etching process. In some embodiments, the etching process may be a wet etching process including etchants such as, TMAH, NH$_4$OH, or the like. Silicon nanostructure channels can be formed according to various configurations, shapes, or sizes, such as a first silicon nanostructure channel 1218b having a cylindrical configuration, a second silicon nanostructure channel 1208b having the cylindrical configuration, and a third silicon nanostructure channel 1212b having the cylindrical configuration. In this way, source regions, drain regions, and silicon nanostructure channels are formed for a first NMOS nanostructure transistor 1306 or other NMOS nanostructure transistor. The cylindrical configurations of the nanostructure channels can be any cylindrical configuration, such as a circular cylinder, an elliptic cylinder, or the like.

In some embodiments, the first silicon nanostructure channel 1218b has a width W7, the second silicon nanostructure channel 1208b has a width W8, and the third silicon nanostructure channel 1212b has a width W9, with each of the widths being measured in a direction parallel to a major surface of the substrate 202. In some embodiments, the width W7 is less than W8 and the width W8 is less than W9.

In FIG. 14, interfacial layers 1230, gate dielectric layers 1232, work function layers 1234, and gate electrodes 1236 are formed for replacement gates. The interfacial layers 1230 are formed conformally on the nanostructure channels. In some embodiments, the interfacial layers 1230 comprise nitride, oxide, or other suitable material.

The gate dielectric layers 1232 are deposited conformally over the nanostructure channels. The interfacial layer 1230 may also be considered a gate dielectric layers and the gate dielectric layers may be referred to as 1230/1232. In the first NMOS nanostructure transistor 1306, the gate dielectric layers 1232 may be formed on top surfaces and sidewalls of the substrate/fins 202 and on top surfaces, sidewalls, and bottom surfaces of the silicon nanostructure channels 1218b, 1208b, and 1212b, and in the first PMOS nanostructure transistor 1304, the gate dielectric layers 1232 may be formed on top surfaces and sidewalls of the substrate/fins 202 and on top surfaces, sidewalls, and bottom surfaces of the germanium nanostructure channels 1206b, 1210b, and 1214b. The gate dielectric layers 1232 may also be deposited on top surfaces of dielectric layers, such as an interlayer dielectric, spacers, and isolation structures 204.

In accordance with some embodiments, the gate dielectric layers 1232 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 1232 include a high-k dielectric material, and in these embodiments, the gate dielectric layers 1232 may have a k value greater than about 7.0, and may include a metal oxide or a silicate of hafnium, aluminum, zirconium, lanthanum, manganese, barium, titanium, lead, and combinations thereof. The structure of the gate dielectric layers 1232 may be the same or different in the first NMOS nanostructure transistor 1306 and the first PMOS nanostructure transistor 1304. The formation methods of the gate dielectric layers 1232 may include molecular-beam deposition (MBD), ALD, PECVD, and the like.

The work function layers (also referred to as liner layers) 1234 are deposited over the gate dielectric layers 1232. The work function layers 1234 may be formed conformally over the gate dielectric layers 1232. The work function layers 1234 may include a metal-containing material such as titanium nitride, titanium oxide, tantalum nitride, tantalum carbide, cobalt, ruthenium, aluminum, tungsten, combinations thereof, or multi-layers thereof. The work function layers 1234 may comprise any number of liner layers and any number of work function tuning layers.

The gate electrodes 1236 are deposited over the work function layers 1234 and fill the remaining portions of the recesses around the nanostructure channels. The work function layers 1234 may also be considered a gate electrode layer and the gate electrodes may be referred to as 1234/1236. The gate electrodes 1236 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 1236 are illustrated in FIG. 14, the gate electrodes 1236 may comprise any number of fill material layers. Any combination of the layers which make up the gate electrodes 1236 may be deposited in the first NMOS nanostructure transistor 1306 between adjacent ones of the silicon nanostructure channels 1218b, 1208b, 1212b and the substrate/fin 202, and may be deposited in the first PMOS nanostructure transistor 1304 between adjacent ones of the germanium nanostructure channels 1206b, 1210b, 1214b, and the substrate/fin 202. The gate electrodes 1232, the work function layers 1234, the gate dielectric layers 1232, and the interfacial layers 1230 may be collectively referred to as "gate structures."

In this embodiment, the gate dielectric layers 1230/1232 merges between adjacent nanostructure channels such that the work function layers 1234 and the gate electrodes 1236 do not completely surround each of the nanostructure channels. In this way, the gate structures are formed around some, but not all, surfaces of the silicon and germanium nanostructure channels, which can increase channel density within the first NMOS nanostructure transistor 1306 and the first PMOS nanostructure transistor 1304. The spacing between the adjacent nanostructure channels is largely determined on the thickness of the layers of the silicon and silicon germanium stacks as they are formed. For example, the thinner the layers are formed, the smaller the spacing and the more likely the gate dielectric layers 1230/1232 will merge between adjacent nanostructure channels. In this embodiment where the gate dielectric layers 1230/1232 merges between adjacent nanostructure channels, the thickness of the removed layers of the silicon and silicon germanium stacks (e.g., the silicon layers 1218, 1208, and 1212 in first PMOS nanostructure transistor 1304 and the silicon germanium layers 1206, 1210, and 1214 in first NMOS nanostructure transistor 1306) is less than two times the of the combined thickness of the interfacial layer 1230 and the gate dielectric layer 1232.

The formation of the gate dielectric layers 1230/1232 in first NMOS nanostructure transistor 1306 and first PMOS nanostructure transistor 1304 may occur simultaneously such that the gate dielectric layers 1230/1232 in each region are formed from the same materials, and the formation of the gate electrodes 1234/1236 may occur simultaneously such that the gate electrodes 1234/1236 in each region are formed from the same materials. In some embodiments, the gate dielectric layers 1230/1232 in each region may be formed by distinct processes, such that the gate dielectric layers 1230/1232 may be different materials and/or have a different number of layers, and/or the gate electrodes 1234/1236 in each region may be formed by distinct processes, such that the gate electrodes 1234/1236 may be different materials and/or have a different number of layers. Various masking steps may be used to mask and expose appropriate regions when using distinct processes.

After depositing the gate electrodes 1236, a planarization process, such as a CMP, may be performed to remove the excess portions of the gate dielectric layers 1230/1232 and the material of the gate electrodes. The remaining portions of material of the gate electrodes 1234/1236 and the gate dielectric layers 1230/1232 thus form replacement gate structures of the resulting first NMOS nanostructure transistor 1306 and first PMOS nanostructure transistor 1304.

Figure 15:
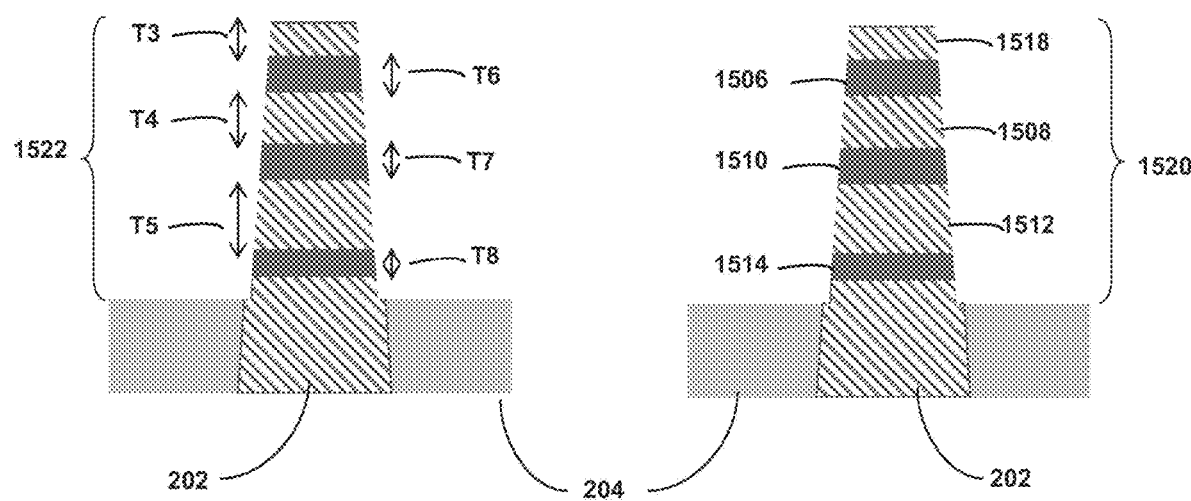
FIGS. 15 through 17 are cross-sectional views of intermediate stages in the manufacturing of nano-FETs, in accordance with some embodiments.
Figure 16:
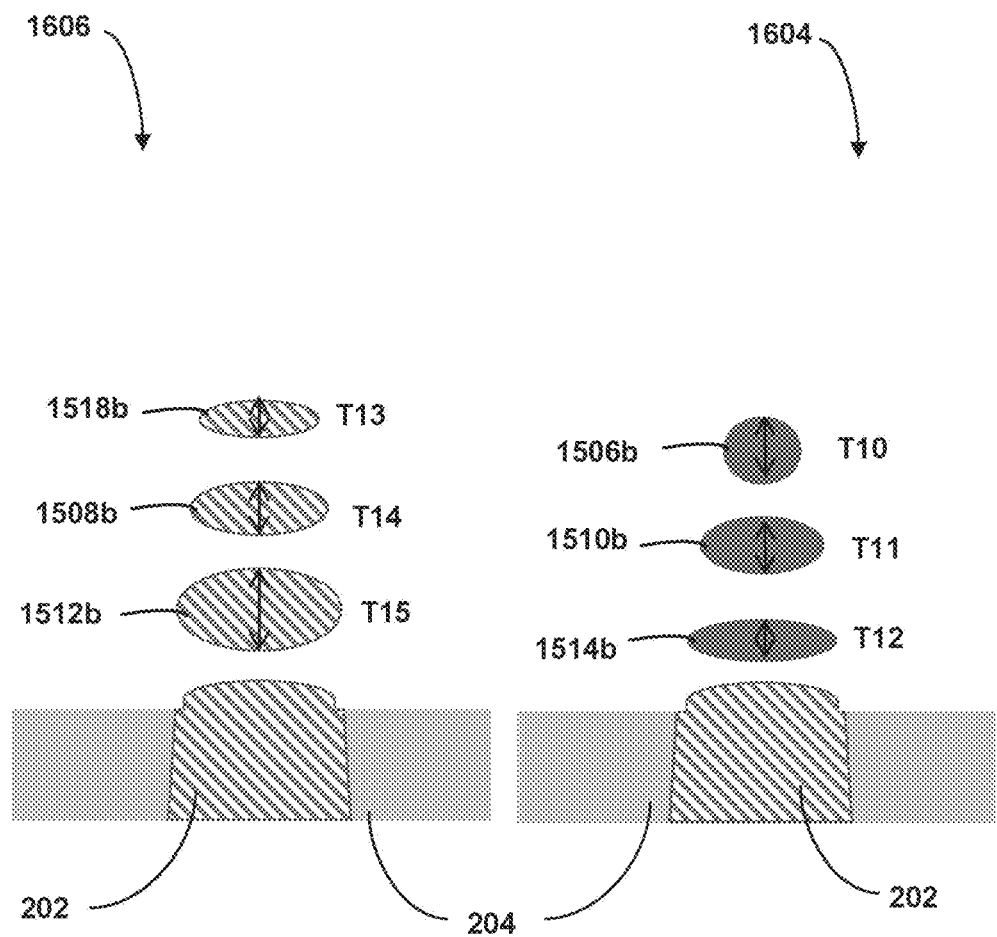
Figure 17:
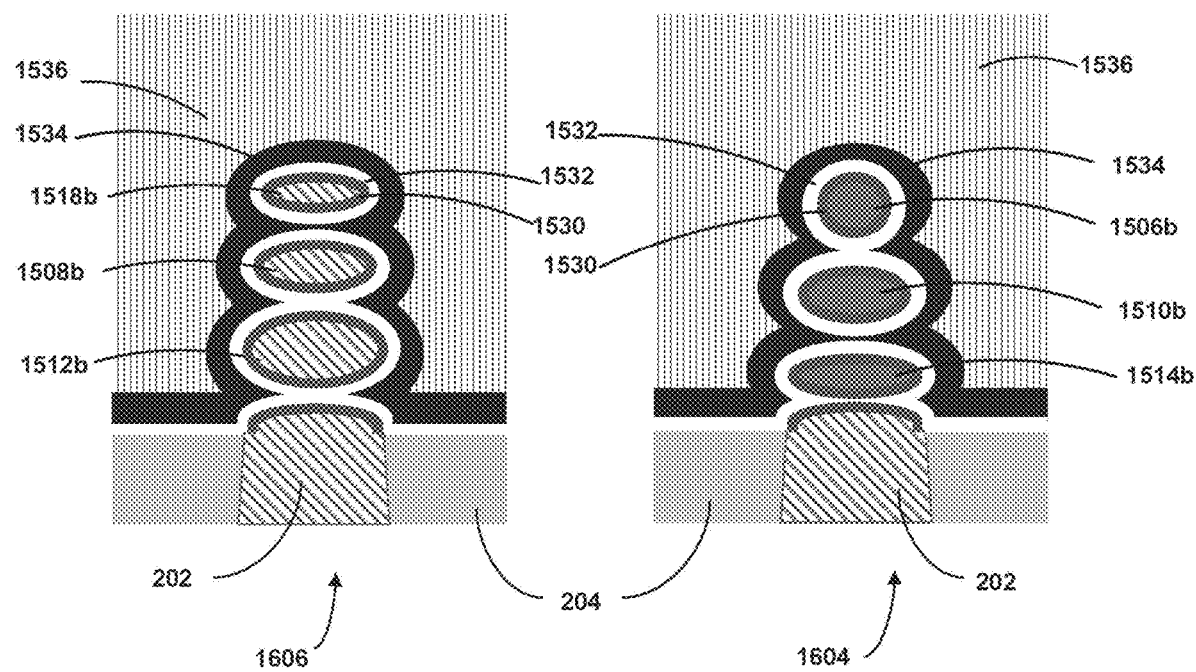

FIGS. 15 through 17 are cross-sectional views of intermediate stages in the manufacturing of nano-FETs, in accordance with some embodiments. FIGS. 15 through 17 illustrate reference cross-section A-A' illustrated in FIGS. 2 and 8. Cross-section A-A' in FIGS. 2 and 8 are each along a longitudinal axis of a gate electrode and in a direction, for example, perpendicular to the direction of current flow between the epitaxial source/drain regions of the nano-FET.

The embodiment in FIGS. 15 through 17 is similar to the previous embodiment of FIGS. 12 through 14 except that this embodiment includes silicon and silicon germanium stacks with the silicon and silicon germanium layers having different thicknesses. Details regarding this embodiment that are similar to those for the previously described embodiment will not be repeated herein.

In FIG. 15, a silicon and silicon germanium stack 1520, a silicon and silicon germanium stack 1522, or other silicon and silicon germanium stacks are formed over the substrate/fins 202, as illustrated. The silicon and silicon germanium stack 1520 and 1522 comprise one or more silicon layers and one or more silicon germanium layers. For example, the silicon and silicon germanium stack 1520 comprises a first silicon layer 1518, a first silicon germanium layer 1506, a second silicon layer 1508, a second silicon germanium layer 1510, a third silicon layer 1512, and a third silicon germanium layer 1514. It is appreciated that any number of silicon layers or silicon germanium layers can be formed.

In the embodiment of FIGS. 15 through 17, the silicon layers 1518, 1508, and 1512 of the stacks 1520 and 1522 have different thicknesses. In a specific embodiment, thicknesses of the silicon layers 1518, 1508, and 1512 decreases when moving from the bottom to the top of the stacks. The first silicon layer 1518 has a thickness T3 in a range from about 3 nm to about 10 nm, such as about 5 nm. The second silicon layer 1508 has a thickness T4 in a range from about 5 nm to about 15 nm, such as about 10 nm. The third silicon layer 1512 has a thickness T5 in a range from about 10 nm to about 20 nm, such as about 15 nm. In some embodiments, T3 is less than T4 and T4 is less than T5. The thicknesses T3, T4, and T5 are measured in a direction perpendicular to a major surface of the substrate 202.

Further, in this embodiment, the silicon germanium layers 1506, 1510, and 1514 of the stacks 1520 and 1522 have different thicknesses. In a specific embodiment, thicknesses of the silicon germanium layers 1506, 1510, and 1514 increases when moving from the bottom to the top of the stacks. The first silicon germanium layer 1506 has a thickness T6 in a range from about 10 nm to about 20 nm, such as about 15 nm. The second silicon germanium layer 1510 has a thickness T7 in a range from about 5 nm to about 15 nm, such as about 10 nm. The third silicon germanium layer 1514 has a thickness T8 in a range from about 3 nm to about 10 nm, such as about 5 nm. In some embodiments, T6 is greater than T7 and T is greater than T8. The thicknesses T6, T7, and T8 are measured in a direction perpendicular to a major surface of the substrate 202.

In this embodiment, the silicon and silicon germanium stack 1520 will be subsequently utilized in a PMOS nanostructure transistor, and the silicon and silicon germanium stack 1522 will be subsequently utilized in an NMOS nanostructure transistor.

FIG. 16 illustrates an intermediate stage of processing with the nanostructure channels formed. The processing between FIGS. 15 and 16 is similar to that described in FIGS. 2 through 5 and FIGS. 8-10 above and the description of forming this intermediate stage of processing is not repeated herein.

In FIG. 16, the silicon layers of the silicon and silicon germanium stack 1520 are removed to expose the germanium nanostructure channels, and to form a region within which a gate structure can be formed. In an example, the first silicon layer 1518, the second silicon layer 1508, and the third silicon layer 1512, or other silicon layer are removed by an etching process. In some embodiments, the etching process may be a wet etching process including etchants such as, TMAH, $NH_4OH$, or the like. Germanium nanostructure channels can be formed according to various configurations, shapes, or sizes, such as a first germanium nanostructure channel 1506b having a cylindrical configuration, a second germanium nanostructure channel 1510b having the cylindrical configuration, and a third germanium nanostructure channel 1514b having the cylindrical configuration. In this way, source regions, drain regions, and germanium nanostructure channels are formed for a first PMOS nanostructure transistor 1604 or other PMOS nanostructure transistor.

In some embodiments, the first germanium nanostructure channel 1506b has a thickness T10, the second germanium nanostructure channel 1510b has a thickness T11, and the third germanium nanostructure channel 1514b has a thickness T10, with each of the thicknesses being measured in a direction perpendicular to a major surface of the substrate 202. In some embodiments, the thickness T10 is greater than thickness T11 and the thickness T11 is greater than thickness T12.

Further in FIG. 16, the silicon germanium layers of the silicon and silicon germanium stack 1522 are removed to expose the silicon nanostructure channels, and to form a region within which a gate structure can be formed. In an example, the first silicon germanium layer 1506, the second silicon germanium layer 1510, and the third silicon germanium layer 1514, or other silicon germanium layer are removed by an etching process. In some embodiments, the etching process may be a wet etching process including etchants such as, TMAH, $NH_4OH$, or the like. Silicon nanostructure channels can be formed according to various configurations, shapes, or sizes, such as a first silicon nanostructure channel 1518b having a cylindrical configuration, a second silicon nanostructure channel 1508b having the cylindrical configuration, and a third silicon nanostructure channel 1512b having the cylindrical configuration. In this way, source regions, drain regions, and silicon nanostructure channels are formed for a first NMOS nanostructure transistor 1606 or other NMOS nanostructure transistor.

In some embodiments, the first silicon nanostructure channel 1518b has a thickness T13, the second silicon nanostructure channel 1508b has a thickness T14, and the third silicon nanostructure channel 1512b has a thickness T15, with each of the thicknesses being measured in a direction perpendicular to a major surface of the substrate 202. In some embodiments, the thickness T13 is less than thickness T14 and the thickness T14 is less than thickness T15.

In FIG. 17, interfacial layers 1530, gate dielectric layers 1532, work function layers 1534, and gate electrodes 1536 are formed for replacement gates. The interfacial layers 1530, gate dielectric layers 1532, work function layers 1534, and gate electrodes 1536 are similar to the interfacial layers 1230, the gate dielectric layers 1232, the work function layers 1234, and the gate electrodes 1236, respectively, described above and the description is not repeated herein. formed conformally on the nanostructure channels.

In this embodiment, the gate dielectric layers 1530/1532 merges between some of the adjacent nanostructure channels such that the work function layers 1234 and the gate electrodes 1236 do not completely surround some of the nanostructure channels. Also, in this embodiment, the gate dielectric layers 1530/1532 do not merge between some of the adjacent nanostructure channels such that the work function layers 1234 and the gate electrodes 1236 do completely surround some of the nanostructure channels. The spacing between the adjacent nanostructure channels is largely determined on the thickness of the layers of the silicon and silicon germanium stacks as they are formed. For example, the thinner the layers are formed, the smaller the spacing and the more likely the gate dielectric layers 1230/1232 will merge between adjacent nanostructure channels.

In this embodiment, the thickness T6 of the silicon germanium layer 1506 is greater than two times the of the combined thickness of the interfacial layer 1530 and the gate dielectric layer 1532 such that the gate dielectric layer 1530/1532 do not merge between the silicon nanostructure channels 1518b and 1508b in the NMOS nanostructure transistor 1606. In this embodiment, the thicknesses T7 and T8 of the silicon germanium layers 1510 and 1514, respectively, is less than two times the of the combined thickness of the interfacial layer 1530 and the gate dielectric layer 1532 such that the gate dielectric layer 1530/1532 does merge between the silicon nanostructure channels 1508b and 1512b and the substrate/fin 202 in the NMOS nanostructure transistor 1606.

In this embodiment, the thickness T5 of the silicon layer 1512 is greater than two times the of the combined thickness of the interfacial layer 1530 and the gate dielectric layer 1532 such that the gate dielectric layer 1530/1532 do not merge between the silicon germanium nanostructure channels 1514b and 1510b in the PMOS nanostructure transistor 1604. In this embodiment, the thicknesses T4 and T3 of the silicon layers 1508 and 1518, respectively, is less than two times the of the combined thickness of the interfacial layer 1530 and the gate dielectric layer 1532 such that the gate dielectric layer 1530/1532 does merge between the silicon germanium nanostructure channels 1510b and 1506b in the PMOS nanostructure transistor 1604.

Figure 18:
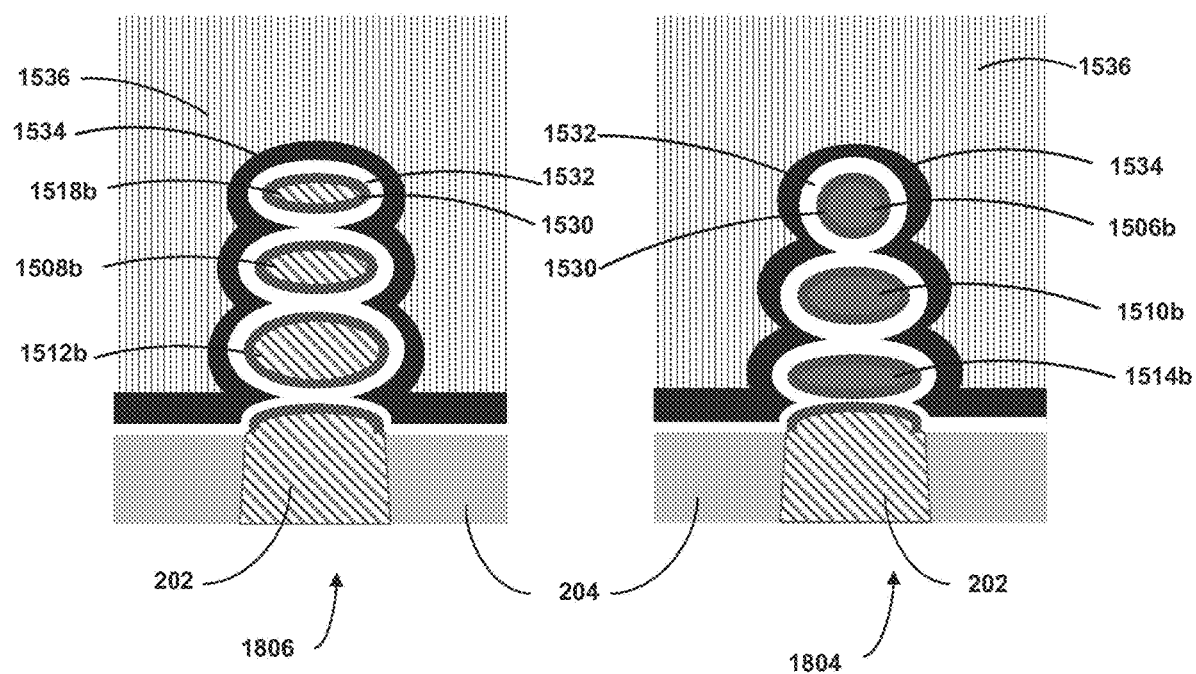
FIG. 18 is a cross-sectional view of an intermediate stage in the manufacturing of nano-FETs, in accordance with some embodiments.

FIG. 18 is a cross-sectional view of an intermediate stages in the manufacturing of nano-FETs, in accordance with some embodiments. FIG. 18 illustrates reference cross-section A-A' illustrated in FIGS. 2 and 8. Cross-section A-A' in FIGS. 2 and 8 are each along a longitudinal axis of a gate electrode and in a direction, for example, perpendicular to the direction of current flow between the epitaxial source/drain regions of the nano-FET.

The embodiment in FIG. 18 is similar to the previous embodiment of FIGS. 15 through 17 except that in this embodiment the gate dielectric layers 1530/1532 merge between each of the nanostructure channels. Details regarding this embodiment that are similar to those for the previously described embodiment will not be repeated herein.

In this embodiment, the thicknesses T3 through T8 are different similar to the previous embodiment, but in this embodiment, the thicknesses T3 through T8 are tuned to have the gate dielectric layers 1530/1532 merge between each of the nanostructure channels. This can be accomplished by reducing each of the thicknesses to be less than two times the of the combined thickness of the interfacial layer 1530 and the gate dielectric layer 1532 such that the gate dielectric layer 1530/1532 merges between adjacent nanostructure channels. In this way, the gate structures are formed around some, but not all, surfaces of the silicon and germanium nanostructure channels, which can increase channel density within the NMOS nanostructure transistor 1806 and the first PMOS nanostructure transistor 1804.

According to an aspect of the instant disclosure, a semiconductor arrangement is provided. The semiconductor arrangement comprises a first nanostructure transistor, such as a PMOS transistor. The first nanostructure transistor comprises a first germanium nanostructure channel formed between a first source region and a first drain region. The first nanostructure transistor comprises a first gate structure formed around the first germanium nanostructure channel. The semiconductor arrangement comprises a second nanostructure transistor, such as an NMOS transistor. The second nanostructure transistor comprises a first silicon nanostructure channel formed between a second source region and a second drain region According to an aspect of the instant disclosure, a method for forming a semiconductor arrangement is provided. The method comprises forming a first silicon and silicon germanium stack over a substrate. The first silicon and silicon germanium stack comprises a first silicon layer and a first silicon germanium layer. A first source region is formed adjacent to a first side of the first silicon and silicon germanium stack. A first drain region is formed adjacent to a second side of the first silicon and silicon germanium stack. The first silicon and silicon germanium stack is oxidized to form a first germanium nanostructure channel. The oxidizing comprises transforming the first silicon layer and silicon of the first silicon and germanium layer into a silicon oxide region. The first germanium nanostructure channel is formed between the first source region and the first drain region. The silicon oxide region is removed. A first gate structure is formed around the first germanium nanostructure channel to form a first nanostructure transistor. A second nanostructure transistor comprising a first silicon nanostructure channel is formed within the semiconductor arrangement.

According to an aspect of the instant disclosure, a semiconductor arrangement is provided. The semiconductor arrangement comprises a PMOS nanostructure transistor. The PMOS nanostructure transistor comprises a first germanium nanostructure channel formed between a first source region and a first drain region. The PMOS nanostructure transistor comprises a first gate structure formed around the first germanium nanostructure channel. The semiconductor arrangement comprises an NMOS nanostructure transistor. The NMOS nanostructure transistor comprises a first silicon nanostructure channel formed between a second source region and a second drain region. The NMOS nanostructure transistor comprises a second gate structure formed around the first silicon nanostructure channel.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A device comprising:
    a first nanostructure transistor comprising:
        a plurality of first nanosheets over a first fin, the plurality of first nanosheets being nanosheets of a first semiconductor material, each of the plurality of first nanosheets having a different width, an upper nanosheet of the plurality of first nanosheets being thicker than a lower nanosheet of the plurality of first nanosheets, the thicknesses of the plurality of first and second nanosheets being measured in a direction perpendicular to the widths of the plurality of first and second nanosheets;
        first source/drain regions on opposing ends of the plurality of first nanosheets;
        a first dielectric layer surrounding each of the plurality of first nanosheets;
        a first work function layer over the first dielectric layer, wherein the first work function layer completely surrounds the lower nanosheet of the plurality of first nanosheets, and wherein the first work function layer does not completely surround the upper nanosheet the plurality of first nanosheets; and
        a first gate fill over the first work function layer.

2. The device of claim 1, wherein the first transistor nanostructure transistor is a PMOS nanostructure transistor.

3. The device of claim 1, wherein the plurality of first nanosheets comprise a plurality of germanium nanosheets.

4. The device of claim 1 further comprising:
    a second nanostructure transistor comprising:
        a plurality of second nanosheets over a second fin, the plurality of second nanosheets being nanosheets of a second semiconductor material different than the first semiconductor material;
        second source/drain regions on opposing ends of the plurality of second nanosheets;
        a second dielectric layer surrounding each of the plurality of second nanosheets;
        a second work function layer over the second dielectric layer; and
        a second gate fill over the second work function layer.

5. The device of claim 4, wherein an upper nanosheet of the plurality of first nanosheets is thicker than a lower nanosheet of the plurality of first nanosheets, and wherein an upper nanosheet of the plurality of second nanosheets is thinner than a lower nanosheet of the plurality of second nanosheets, the thicknesses of the plurality of first and second nanosheets being measured in a direction perpendicular to the widths of the plurality of first and second nanosheets.

6. The device of claim 4, wherein each of the plurality of second nanosheets have a different width.

7. The device of claim 4, wherein the second work function layer completely surrounds the upper nanosheet of the plurality of second nanosheets, and wherein the second work function layer does not completely surround the lower nanosheet the plurality of second nanosheets.

8. A semiconductor device comprising:
    a first nanostructure transistor over a substrate, the first nanostructure transistor comprising:
        a first nanostructure channel extending from a first source region to a first drain region, the first nanostructure channel having a first thickness;
        a second nanostructure channel extending from the first source region to the first drain region, the second nanostructure channel being over the first nanostructure channel, the second nanostructure channel having a second thickness greater than the first thickness;
a first dielectric layer surrounding the first nanostructure channel and the second nanostructure channel;
a first work function layer over the first dielectric layer and at least partially surrounding the first nanostructure channel and the second nanostructure channel, the first work function layer separating the first dielectric layer on the first nanostructure channel and the first dielectric layer on the second nanostructure channel; and
a first gate electrode over the first work function layer
a second nanostructure transistor over the substrate, the second nanostructure transistor comprising:
a third nanostructure channel extending from a second source region to a second drain region, the third nanostructure channel having a third thickness;
a fourth nanostructure channel extending from the second source region to the second drain region, the fourth nanostructure channel being over the third nanostructure channel, the fourth nanostructure channel having a fourth thickness less than the third thickness;
a second dielectric layer surrounding the third nanostructure channel and the fourth nanostructure channel; and
a second gate electrode over the second dielectric layer and at least partially surrounding the third nanostructure channel and the fourth nanostructure channel.

9. The semiconductor device of claim 8, wherein the first nanostructure channel has a first width, the second nanostructure channel having a second width different than the first width.

10. The semiconductor device of claim 9, wherein the second width is less than the first width.

11. The semiconductor device of claim 8 further comprising:
an interfacial layer surrounding the first nanostructure channel and the second nanostructure channel, the interfacial layer being between the first dielectric layer and the first nanostructure channel and the second nanostructure channel.

12. The semiconductor device of claim 8, wherein the first work function layer completely surrounds the second nanostructure channel and only partially surrounds the first nanostructure channel.

13. The semiconductor device of claim 8, wherein the first nanostructure channel and the second nanostructure channel are germanium nanostructure channels.

14. The semiconductor device of claim 8, wherein the first nanostructure channel and the second nanostructure channel are silicon nanostructure channels.

15. The semiconductor device of claim 8, wherein a space between the first nanostructure channel and the second nanostructure channel is void of the first gate electrode.

16. The semiconductor device of claim 8, wherein the third nanostructure channel has a third width, the fourth nanostructure channel has a fourth width less than the third width.

17. A method comprising:
forming a first silicon and silicon germanium stack over a substrate, the first silicon and silicon germanium stack comprising a first silicon layer and a first silicon germanium layer, the first silicon and silicon germanium stack having a first width at a bottom of the stack and a second width at a top of the stack, the second width being less than the first width;
forming a first source region and a first drain region on opposite ends of the first silicon and silicon germanium stack;
removing the first silicon germanium layer forming a first silicon nanostructure channel between the first source region and the first drain region, the first silicon nanostructure channel having a first thickness;
forming a first gate structure around the first silicon nanostructure channel forming a first nanostructure transistor; and
forming a second nanostructure transistor comprising a first germanium nanostructure channel, the first germanium nanostructure channel having a second thickness different than the first thickness.

18. The method of claim 17 further comprising:
forming a second silicon nanostructure channel in the first nanostructure transistor, the second silicon nanostructure channel having a different width than the first silicon nanostructure channel.

19. The method of claim 17, wherein the second thickness is thinner than the first thickness.

20. The method of claim 17, wherein the first nanostructure transistor comprises a plurality of silicon nanostructure channels, an upper silicon nanostructure channel of the plurality of silicon nanostructure channels being thinner than a lower silicon nanostructure channel of the plurality of silicon nanostructure channels, and wherein the second nanostructure transistor comprises a plurality of germanium nanostructure channels, an upper germanium nanostructure channel of the plurality of germanium nanostructure channels being thicker than a lower germanium nanostructure channel of the plurality of germanium nanostructure channels.

* * * * *

UNITED STATES PATENT AND TRADEMARK OFFICE
CERTIFICATE OF CORRECTION

PATENT NO. : 11,854,905 B2
APPLICATION NO. : 17/814692
DATED : December 26, 2023
INVENTOR(S) : Ng et al.

It is certified that error appears in the above-identified patent and that said Letters Patent is hereby corrected as shown below:

In the Claims

In Column 18, in Claim 2, Line 26, after "first" delete "transistor".

Signed and Sealed this
Ninth Day of April, 2024

Katherine Kelly Vidal
Director of the United States Patent and Trademark Office